(12) United States Patent
Ha et al.

(10) Patent No.: US 9,739,593 B2
(45) Date of Patent: Aug. 22, 2017

(54) METHOD AND APPARATUS FOR COUPLING WAVELENGTH-SWEPT LIGHT BY CONTROLLING ON/OFF TIMINGS OF CURRENT APPLIED TO THE GAIN MEDIUMS

(71) Applicant: Samsung Electronics Co., Ltd., Suwon-si (KR)

(72) Inventors: Jin-yong Ha, Seongnam-si (KR); Hong-sig Kim, Seongnam-si (KR); Woo-young Jang, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 179 days.

(21) Appl. No.: 13/893,577

(22) Filed: May 14, 2013

(65) Prior Publication Data

US 2013/0301057 A1    Nov. 14, 2013

Related U.S. Application Data

(60) Provisional application No. 61/646,464, filed on May 14, 2012.

(30) Foreign Application Priority Data

Dec. 4, 2012    (KR) .......................... 10-2012-0139829

(51) Int. Cl.
    *G01B 9/02*    (2006.01)
    *H05B 37/02*    (2006.01)
    (Continued)

(52) U.S. Cl.
    CPC .......... *G01B 9/02091* (2013.01); *H01S 3/083* (2013.01); *H01S 3/10038* (2013.01);
    (Continued)

(58) Field of Classification Search
    CPC ............ G01B 9/02004; G01B 9/02091; H01S 3/2383; H01S 3/2391; H01S 3/083;
    (Continued)

(56) References Cited

U.S. PATENT DOCUMENTS 6,665,320 B1 *  12/2003  Arbore et al. .................. 372/20
7,414,779 B2 *   8/2008  Huber ...................... H01S 3/106
                                                        359/333

(Continued)

FOREIGN PATENT DOCUMENTS

CN    102349205 A    2/2012
JP    2009-31238 A   2/2009
(Continued)

OTHER PUBLICATIONS

W.Y. Oh et al., "Wide Tuning Range Wavelength-Swept Laser with Two Semiconductor Optical Amplifiers," *IEEE Photonics Technology Letters*, vol. 17, No. 3, Mar. 2005, pp. 678-680.
(Continued)

Primary Examiner — Michael P LaPage
(74) Attorney, Agent, or Firm — NSIP Law

(57) ABSTRACT

A method of emitting wavelength-swept light includes controlling either one or both of magnitudes and on/off timings of currents to be applied to a first gain medium of a first optical generator and a second gain medium of a second optical generator to control an intensity and a wavelength region of each of first wavelength-swept light and second wavelength-swept light; generating the first wavelength-swept light having a first center wavelength based on the current applied to the first gain medium of the first optical generator; generating the second wavelength-swept light having a second center wavelength based on the current applied to the second gain medium of the second optical generator; and emitting output wavelength-swept light by
(Continued)

coupling the first wavelength-swept light and the second wavelength-swept light.

18 Claims, 11 Drawing Sheets

(51) Int. Cl.
*H01S 3/083* (2006.01)
*H01S 3/10* (2006.01)
*H01S 3/106* (2006.01)
*H01S 3/23* (2006.01)
*H01S 5/14* (2006.01)

(52) U.S. Cl.
CPC .......... *H01S 3/1062* (2013.01); *H01S 3/2391* (2013.01); *H05B 37/02* (2013.01); *H01S 5/14* (2013.01)

(58) Field of Classification Search
CPC ...... H01S 3/10038; H01S 3/1062; H01S 5/14; H05B 37/02
See application file for complete search history.

(56) References Cited

U.S. PATENT DOCUMENTS

| | | | |
|---|---|---|---|
| 7,916,387 B2 | 3/2011 | Schmitt | |
| 9,653,868 B2 | 5/2017 | Fermann et al. | |
| 2008/0137094 A1* | 6/2008 | Teramura et al. | 356/489 |
| 2008/0140325 A1* | 6/2008 | Teramura | G01N 21/4795 702/57 |
| 2009/0323080 A1 | 12/2009 | Toida | |
| 2010/0225897 A1* | 9/2010 | Fermann et al. | 356/51 |
| 2010/0309480 A1 | 12/2010 | Furusawa et al. | |
| 2011/0080591 A1* | 4/2011 | Johnson | G01B 9/02004 356/479 |
| 2011/0134433 A1* | 6/2011 | Yamada | A61B 5/0062 356/479 |
| 2011/0170110 A1 | 7/2011 | Oigawa et al. | |
| 2011/0249973 A1 | 10/2011 | Donlagic et al. | |
| 2011/0292399 A1* | 12/2011 | Alphonse | G01B 9/02091 356/479 |
| 2011/0304853 A1* | 12/2011 | Yamada et al. | 356/479 |

FOREIGN PATENT DOCUMENTS

| | | |
|---|---|---|
| JP | 2009-252813 A | 10/2009 |
| JP | 2011-23450 A | 2/2011 |
| JP | 2011-142313 A | 7/2011 |
| JP | 2011-187947 A | 9/2011 |
| JP | 2011-196771 A | 10/2011 |
| JP | 2011-233727 A | 11/2011 |
| KR | 10-2008-0110569 A | 12/2008 |
| KR | 10-0978191 B1 | 8/2010 |
| KR | 10-0993578 B1 | 11/2010 |
| KR | 10-1011562 B1 | 1/2011 |
| KR | 10-1011623 B1 | 1/2011 |
| KR | 10-2011-0036593 A | 4/2011 |
| KR | 10-1107989 B1 | 1/2012 |
| KR | 10-1194900 B1 | 10/2012 |
| WO | WO 2005/047813 A1 | 5/2005 |

OTHER PUBLICATIONS

Chinese Office Action issued on Mar. 31, 2017, in corresponding Chinese Application No. 201310173557.0 (15 pages in English, 7 pages in Chinese).

Extended European Search Report issued on Jun. 19, 2017, in corresponding European Application No. 13167623.1 (9 pages, in English).

* cited by examiner

METHOD AND APPARATUS FOR COUPLING WAVELENGTH-SWEPT LIGHT BY CONTROLLING ON/OFF TIMINGS OF CURRENT APPLIED TO THE GAIN MEDIUMS

CROSS-REFERENCE TO RELATED APPLICATIONS

This application claims the benefit of U.S. Provisional Application No. 61/646,464 filed on May 14, 2012, and Korean Patent Application No. 10-2012-0139829 filed on Dec. 4, 2012, in the Korean Intellectual Property Office, the disclosures of which are incorporated herein by reference in their entirety for all purposes.

BACKGROUND

1. Field

This application relates to methods and apparatuses for emitting wavelength-swept light.

2. Description of Related Art

Light is used in various fields by using characteristics of light, such as monochromaticity, coherence, and directionality. Light is used in a variety of observations of tissue and cells, diagnosis of diseases, and laser therapy even in the biofield and the medical field.

In particular, in the medical field, since the characteristics of light allow an internal structure of the human body to be observed without directly incising the human body, a cause, a location, and a progress of each of various diseases may be easily and safely detected using light. Along with the development of technologies for generating light, such as high power, continuous waves, and wavelength sweeping, a light transmission depth and the like are improved, thereby acquiring tomographic images of living tissue or cells at a high resolution in real time.

SUMMARY

In one general aspect, a light emission apparatus for emitting wavelength-swept light includes a first optical generator configured to generate first wavelength-swept light and including a first gain medium, a first wavelength-swept filter, and a first optical resonance unit; a second optical generator configured to generate second wavelength-swept light having a center wavelength that is different from a center wavelength of the first wavelength-swept light and including a second gain medium, a second wavelength-swept filter, and a second optical resonance unit; a coupling unit configured to couple the first wavelength-swept light and the second wavelength-swept light to output an output wavelength-swept light for emission; and a controller configured to control an intensity and a wavelength region of each of the first wavelength-swept light and the second wavelength-swept light by controlling either one or both of magnitudes and on/off timings of currents to be applied to the first gain medium and the second gain medium.

The controller may be further configured to control the intensity and the wavelength region of each of the first wavelength-swept light and the second wavelength-swept light so that a spectrum of the output wavelength-swept light has a Gaussian shape.

The controller may be further configured to control the on/off timings of the currents to be applied to the first gain medium and the second gain medium so that the wavelength region of the first wavelength-swept light and the wavelength region of the second wavelength-swept light do not overlap each other.

The controller may be further configured to control the on/off timings of the currents so that the current applied to the second gain medium is turned on while the current applied to the first gain medium is turned off, and the current applied to the first gain medium is turned on while the current applied to the second gain medium is turned off.

The light emission apparatus may further include an optical signal extractor configured to extract an optical signal in a predetermined wavelength region of any one of the first wavelength-swept light, the second wavelength-swept light, and the output wavelength-swept light; and a synchronization signal generator configured to generate a synchronization signal for synchronizing an operation of performing stimulated emission and amplification of light in each of the first gain medium and the second gain medium with an operation of sweeping wavelengths of lights in a respective one of the first wavelength-swept filter of the first optical generator and the second wavelength-swept filter of the second optical generator based on the extracted optical signal; wherein the controller may be further configured to control the first gain medium, the second gain medium, the first wavelength-swept filter, and the second wavelength-swept filter by generating currents to be applied to the first gain medium and the second gain medium and voltages to be applied to the first wavelength-swept filter and the second wavelength-swept filter based on the synchronization signal.

The light emission apparatus may be further configured to output the output wavelength-swept light to an interferometer; and the optical signal extractor may be further configured to extract an optical signal in a predetermined wavelength region of the output wavelength-swept light from a reference arm of the interferometer.

The light emission apparatus may further include a third optical generator configured to generate third wavelength-swept light having a wavelength region other than a wavelength region of the first wavelength-swept light; and a fourth optical generator configured to generate fourth wavelength-swept light having a wavelength region other than a wavelength region of the second wavelength-swept light; wherein the coupling unit may be further configured to output the output wavelength-swept light by coupling the first wavelength-swept light, the second wavelength-swept light, the third wavelength-swept light, and the fourth wavelength-swept light; and the controller may be further configured to control an intensity and a wavelength region of each of the first wavelength-swept light, the second wavelength-swept light, the third wavelength-swept light, and the fourth wavelength-swept light.

The coupling unit may be further configured to couple the first wavelength-swept light and the third wavelength-swept light using a wavelength-division multiplexing (WDM) method, couple the second wavelength-swept light and the fourth wavelength-swept light using a WDM method, and output the output wavelength-swept light by coupling coupled wavelength-swept light of the first wavelength-swept light and the third wavelength-swept light and coupled wavelength-swept light of the second wavelength-swept light and the fourth wavelength-swept light.

The light emission apparatus may further include at least one additional optical generator; wherein the coupling unit may be further configured to output the output wavelength-swept light by coupling the first wavelength-swept light, the second wavelength-swept light, and wavelength-swept light generated by the at least one additional optical generator;

and the controller may be further configured to control an intensity and a wavelength region of each of the first wavelength-swept light, the second wavelength-swept light, and the wavelength-swept light generated by the at least one additional optical generator.

The light emission apparatus may further include a non-linear fiber amplifier configured to amplify wavelength-swept light coupled by the coupling unit.

In another general aspect, a light emission apparatus for emitting wavelength-swept light includes a first optical generator configured to generate first wavelength-swept light and including a first gain medium, a first wavelength-swept filter, a first optical resonance unit, and a first optical amplifier; a second optical generator configured to generate second wavelength-swept light having a center wavelength that is different from a center wavelength of the first wavelength-swept light and including a second gain medium, a second wavelength-swept filter, a second optical resonance unit, and a second optical amplifier; a coupling unit configured to couple the first wavelength-swept light and the second wavelength-swept light to output an output wavelength-swept light for emission; and a controller configured to control an intensity and a wavelength region of each of the first wavelength-swept light and the second wavelength-swept light by controlling either one or both of magnitudes and on/off timings of currents to be applied to the first optical amplifier and the second optical amplifier; wherein the first optical generator may be further configured to generate the first wavelength-swept light by using the first optical amplifier to amplify wavelength-swept light generated using the first gain medium, the first wavelength-swept filter, and the first optical resonance unit; and the second optical generator may be further configured to generate the second wavelength-swept light by using the second optical amplifier to amplify wavelength-swept light generated using the second gain medium, the second wavelength-swept filter, and the second optical resonance unit.

The first optical generator may further include a first buffer configured to store wavelength-swept lights generated using the first gain medium, the first wavelength-swept filter, and the first optical resonance unit; the second optical generator may further include a second buffer configured to store wavelength-swept lights generated using the second gain medium, the second wavelength-swept filter, and the second optical resonance unit; the first optical generator may be further configured to generate third wavelength-swept light swept in a wavelength region other than wavelength regions of the wavelength-swept lights stored in the first buffer, and generate the first wavelength-swept light by using the first optical amplifier to amplify wavelength-swept light obtained by coupling the third wavelength-swept light and the wavelength-swept lights stored in the first buffer; and the second optical generator may be further configured to generate fourth wavelength-swept light swept in a wavelength region other than wavelength regions of the wavelength-swept lights stored in the second buffer, and generate the second wavelength-swept light by using the second optical amplifier to amplify wavelength-swept light obtained by coupling the fourth wavelength-swept light and the wavelength-swept lights stored in the second buffer.

The light emission apparatus may further include at least one additional optical generator including a gain medium, a wavelength-swept filter, an optical resonance unit, and an optical amplifier; wherein the coupling unit may be further configured to output the output wavelength-swept light by coupling the first wavelength-swept light, the second wavelength-swept light, and wavelength-swept light generated by the at least one additional optical generator; and the controller may be further configured to control an intensity and a wavelength region of each of the first wavelength-swept light, the second wavelength-swept light, and the wavelength-swept light generated by the at least one additional optical generator by controlling either one or both of magnitudes and on/off timings of currents to be applied to the first optical amplifier, the second optical amplifier, and the optical amplifier of the at least one additional optical generator.

In another general aspect, a light emission apparatus for emitting wavelength-swept light includes a first gain medium configured to emit light having a first center wavelength using stimulated emission and amplification of light; a second gain medium configured to emit light having a second center wavelength that is different from the first center wavelength using stimulated emission and amplification of light; a first optical resonance unit connecting the first gain medium and the second gain medium in parallel and configured to resonate and transmit the lights emitted by the first gain medium and the second gain medium; a wavelength-swept filter configured to sweep wavelengths of the lights emitted by the first gain medium and the second gain medium; a second optical resonance unit connecting the first optical resonance unit and the wavelength-swept filter in series and configure to feed wavelength-swept light swept by the wavelength-swept filter back to the first gain medium and the second gain medium; a coupling unit configured to couple the first wavelength-swept light generated by the first gain medium and the second wavelength-swept light generated by the second gain medium to output an output wavelength-swept light for emission; and a controller configured to control an intensity and a wavelength region of each of the first wavelength-swept light and the second wavelength-swept light by controlling either one or both of magnitudes and on/off timings of currents to be applied to the first gain medium and the second gain medium.

The light emission apparatus may further include at least one additional gain medium configured to emit light having a center wavelength different from the first center wavelength and the second center wavelength using stimulated emission and amplification of light; wherein the coupling unit may be further configured to output the output wavelength-swept light by coupling the first wavelength-swept light, the second wavelength-swept light, and wavelength-swept light generated by the at least one additional gain medium; and the controller may be further configured to control an intensity and a wavelength region of each of the first wavelength-swept light, the second wavelength-swept light, and the wavelength-swept light generated by the at least one additional gain medium by controlling either one or both of magnitudes and on/off timings of currents to be applied to the first gain medium, the second gain medium, and the at least one additional gain medium.

In another general aspect, a light emission apparatus for emitting wavelength-swept light includes a first gain medium configured to emit light having a first center wavelength using stimulated emission and amplification of light; a second gain medium configured to emit light having a second center wavelength that is different from the first center wavelength using stimulated emission and amplification of light; a first optical resonance unit connecting the first gain medium and the second gain medium in parallel and configured to resonate and transmit the lights emitted by the first gain medium and the second gain medium; a wavelength-swept filter configured to sweep wavelengths of the lights emitted by the first gain medium and the second gain medium; a second optical resonance unit connecting the first optical resonance unit and the wavelength-swept filter in series and configured to feed wavelength-swept lights swept by the wavelength-swept filter back to the first gain medium and the second gain medium; a first buffer configured to store wavelength-swept lights generated using the wavelength-swept filter, the first optical resonance unit, the second optical resonance unit, and either one of the first gain medium and the second gain medium, and couple third wavelength-swept light generated using the wavelength-swept filter, the first optical resonance unit, the second optical resonance unit, and either one of the first gain medium and the second gain medium and swept in a wavelength region other than wavelength regions of the stored wavelength-swept lights and the stored wavelength-swept lights to output wavelength-swept light; a first optical amplifier configured to generate first wavelength-swept light by amplifying wavelength-swept light generated using the first gain medium among wavelength-swept lights output from the first buffer; a second optical amplifier connected in parallel with the first optical amplifier and configured to generate second wavelength-swept light by amplifying wavelength-swept light generated using the second gain medium among the wavelength-swept lights output from the first buffer; a coupling unit configured to couple the first wavelength-swept light and the second wavelength-swept light to output an output wavelength-swept light for emission; and a controller configured to control an intensity and a wavelength region of each of the first wavelength-swept light and the second wavelength-swept light by controlling either one or both of magnitudes and on/off timings of currents to be applied to the first optical amplifier and the second optical amplifier.

In another general aspect, a method of emitting wavelength-swept light includes controlling either one or both of magnitudes and on/off timings of currents to be applied to a first gain medium of a first optical generator and a second gain medium of a second optical generator to control an intensity and a wavelength region of each of first wavelength-swept light and second wavelength-swept light; generating the first wavelength-swept light having a first center wavelength based on the current applied to the first gain medium of the first optical generator; generating the second wavelength-swept light having a second center wavelength based on the current applied to the second gain medium of the second optical generator; and emitting an output wavelength-swept light by coupling the first wavelength-swept light and the second wavelength-swept light.

The controlling may include controlling the intensity and the wavelength region of each of the first wavelength-swept light and the second wavelength-swept light so that a spectrum of the output wavelength-swept light has a Gaussian shape.

The controlling may include controlling the on/off timings of the currents to be applied to the first gain medium and the second gain medium so that the wavelength region of the first wavelength-swept light and the wavelength region of the second wavelength-swept light do not overlap each other.

The method may further include extracting an optical signal in a predetermined wavelength region of any one of the first wavelength-swept light, the second wavelength-swept light, and the output wavelength-swept light; and generating a synchronization signal for synchronizing an operation of performing stimulated emission and amplification of light in each of the first gain medium and the second gain medium with an operation of sweeping wavelengths of lights in a respective one of a first wavelength-swept filter of the first optical generator and a second wavelength-swept filter of the second optical generator based on the extracted optical signal; wherein the controlling includes controlling operations of the first gain medium, the second gain medium, the first wavelength-swept filter, and the second wavelength-swept filter by generating currents to be applied to the first gain medium and the second gain medium and voltages to be applied to the first wavelength-swept filter and the second wavelength-swept filter based on the synchronization signal.

In another general aspect, a non-transitory computer-readable storage medium stores program instructions for controlling a computer to perform the method described above.

In another general aspect, an optical coherence tomography apparatus includes a light emission apparatus configured to control either one or both of magnitudes and on/off timings of currents to be applied to a first gain medium of a first optical generator and a second gain medium of a second optical generator to control an intensity and a wavelength region of each of first wavelength-swept light and second wavelength-swept light, generate the first wavelength-swept light having a first center wavelength based on the current applied to the first gain medium in the first optical generator, generate the second wavelength-swept light having a second center wavelength based on the current applied to the second gain medium in the second optical generator, and emit an output wavelength-swept light by coupling the first wavelength-swept light and the second wavelength-swept light; an interferometer configured to split the output wavelength-swept light into measurement light and reference light, irradiate the measurement light on a target object, and receive response light returned as the measurement light is reflected by the target object; a detector configured to detect an interference signal generated by interference of the response light and the reference light; and an image signal processor configured to generate tomography images of the target object using the detected interference signal.

The light emission apparatus may be further configured to control an intensity and a wavelength region of each of the first wavelength-swept light and the second wavelength-swept light so that a spectrum of the output wavelength-swept light has a Gaussian shape.

The light emission apparatus may be further configured to control the on/off timings of the currents to be applied to the first gain medium and the second gain medium so that a wavelength region of the first wavelength-swept light and a wavelength region of the second wavelength-swept light do not overlap each other.

Other features and aspects will be apparent from the following detailed description, the drawings, and the claims.

DETAILED DESCRIPTION

Figure 1:
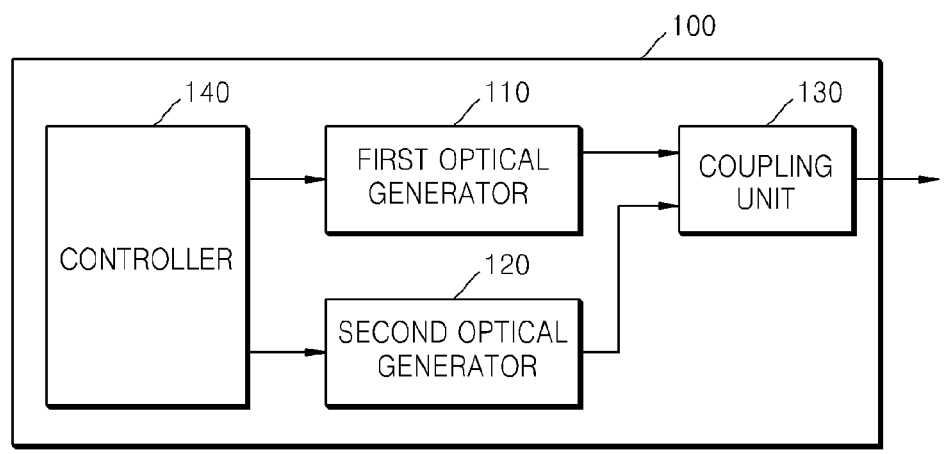
FIG. 1 is a block diagram of an example of a light emission apparatus.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, description of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

FIG. 1 is a block diagram of an example of a light emission apparatus 100. Referring to FIG. 1, the light emission apparatus 100 includes a first optical generator 110, a second optical generator 120, a coupling unit 130, and a controller 140.

For the light emission apparatus 100, only components associated with the current example are shown in FIG. 1 to prevent the features of the current example from being obscured. Thus, it will be understood by one of ordinary skill in the art that other general-use components may be provided in addition to the components shown in FIG. 1.

The first optical generator 110 generates first wavelength-swept light. The first optical generator 110 may include a first gain medium (not shown), a first wavelength-swept filter (not shown), and a first optical resonance unit (not shown). The first optical generator 110 may be implemented in various forms using the first gain medium, the first wavelength-swept filter, and the first optical resonance unit. Detailed examples related to this will be described below with reference to FIGS. 2 to 6. However, the first optical generator 110 is not limited to the examples of FIGS. 2 to 6, and the first optical generator 110 may further include an optical amplifier (not shown), a buffer (not shown), a nonlinear amplifier (not shown), an optical isolator (not shown), and an optical coupler (not shown) in addition to the first gain medium, the first wavelength-swept filter, and the first optical resonance unit.

The first gain medium performs stimulated emission of light within a predetermined wavelength region determined according to characteristics of the first gain medium and amplifies the emitted light. In one example, the first gain medium may be a semiconductor optical amplifier (SOA), but is not limited thereto.

The first wavelength-swept filter generates wavelength-swept light by sweeping wavelengths of the light emitted by the first gain medium. For example, the first wavelength-swept filter may be a Fabry-Perot filter or a polygon scanning filter, but is not limited thereto.

The first optical resonance unit resonates and transmits the wavelength-swept light generated using the first gain medium and the first wavelength-swept filter to amplify the wavelength-swept light until the wavelength-swept light has a predetermined power. The wavelength-swept light is fed back to the first gain medium by the first optical resonance unit and is repeatedly amplified. For example, the first optical resonance unit may include one or more ring cavities, but is not limited thereto. In one example, the first gain medium and the first wavelength-swept filter may be connected to the first optical resonance unit including one or more ring cavities.

The second optical generator 120 may include a second gain medium (not shown), a second wavelength-swept filter (not shown), and a second optical resonance unit (not shown) and generates second wavelength-swept light having a center wavelength that is different from that of the first wavelength-swept light. Like the first optical generator 110, the second optical generator 120 may also be implemented in various forms using the second gain medium, the second wavelength-swept filter, and the second optical resonance unit, and is not limited to the examples of FIGS. 2 to 6. In addition, like the first optical generator 110, the second optical generator 120 may also further include an optical amplifier (not shown), a buffer (not shown), a nonlinear amplifier (not shown), an optical isolator (not shown), and an optical coupler (not shown) in addition to the second gain medium, the second wavelength-swept filter, and the second optical resonance unit.

Since the second gain medium, the second wavelength-swept filter, and the second optical resonance unit of the second optical generator 120 operate the same as the first gain medium, the first wavelength-swept filter, and the first optical resonance unit, respectively, of the first optical generator 110, a description thereof will not be repeated.

A wavelength region and a center wavelength of second wavelength-swept light generated by the second gain medium are determined according to characteristics of the second gain medium. By using a gain medium having different characteristics than the first gain medium as the second gain medium, the center wavelength of the second wavelength-swept light is different from that of the first wavelength-swept light generated by the first gain medium. For example, the first gain medium and the second gain medium may be a 1.2-μm quantum dot SOA and a 1.3-μm quantum well SOA, respectively, but are not limited thereto.

The coupling unit 130 outputs an output wavelength-swept light by coupling the first wavelength-swept light generated by the first optical generator 110 and the second wavelength-swept light generated by the second optical generator 120. The coupling unit 130 may generate broadband wavelength-swept light by adding a predetermined wavelength region determined by the first gain medium to a predetermined wavelength region determined by the second gain medium. Thus, the light emission apparatus 100 may output light of a wider wavelength band than a wavelength band of light that may be generated using one gain medium by coupling two or more wavelength-swept lights. For example, the coupling unit 130 may be implemented using an optical coupler or a wavelength-division multiplexing (WDM) method, but is not limited thereto.

The controller 140 controls an intensity and a wavelength region of each of the first wavelength-swept light and the second wavelength-swept light by controlling either one or both of magnitudes and on/off timings of currents to be applied to the first gain medium of the first optical generator 110 and the second gain medium of the second optical generator 120.

For example, when the magnitude of the current to be applied to the first gain medium is increased by the controller 140, the intensity of the first wavelength-swept light increases. In addition, when the current applied to the first gain medium is turned off for a predetermined time by the controller 140, wavelength-swept light in a predetermined wavelength region corresponding to the predetermined time for which the current is turned off is not generated. Thus, the controller 140 may control the on/off timing of the current to be applied to the first gain medium to determine a wavelength region in which wavelength-swept light is generated.

In addition, the controller 140 may control the intensity of wavelength-swept light to be low in a first wavelength region and to be high in a second wavelength region in a spectrum of the first wavelength-swept light.

In one example, the controller 140 may control an intensity of a wavelength region of each of the first wavelength-swept light and the second wavelength-swept light so that a spectrum of the output wavelength-swept light output from the light emission apparatus 100 has a Gaussian shape.

In another example, the controller 140 may control the on/off timings of the currents to be respectively applied to the first gain medium and the second gain medium so that the wavelength region of the first wavelength-swept light and the wavelength region of the second wavelength-swept light do not overlap each other. For example, the controller 140 may control the on/off timings of the currents so that the current applied to the second gain medium is turned on when the current applied to the first gain medium is turned off, and the current applied to the first gain medium is turned on when the current applied to the second gain medium is turned off. Accordingly, the light emission apparatus 100 may remove intensity noise occurring when wavelength regions of wavelength-swept lights overlap each other.

The controller 140 may correspond to or include at least one processor. In addition, the controller 140 may be located inside the light emission apparatus 100 as shown in FIG. 1, but is not limited thereto. That is, the controller 140 may be located outside the light emission apparatus 100.

In one example, the light emission apparatus 100 may further include at least one optical generator in addition to the first and second optical generators 110 and 120. In this case, the coupling unit 130 may output the output wavelength-swept light by coupling the first wavelength-swept light, the second wavelength-swept light, and light generated by the at least one optical generator, and the controller 140 may control an intensity and a wavelength region of each of the first wavelength-swept light, the second wavelength-swept light, and light generated by the at least one optical generator.

The light emission apparatus 100 outputs the output wavelength-swept light obtained by coupling the first wavelength-swept light and the second wavelength-swept light of which the intensities and the wavelength regions have been controlled. Thus, the light emission apparatus 100 may generate wavelength-swept light of a wide wavelength region having a spectrum of a Gaussian shape. In addition, the light emission apparatus 100 may generate wavelength-swept light of a wide wavelength region having a narrow linewidth due to the removal of the intensity noise.

Figure 2:
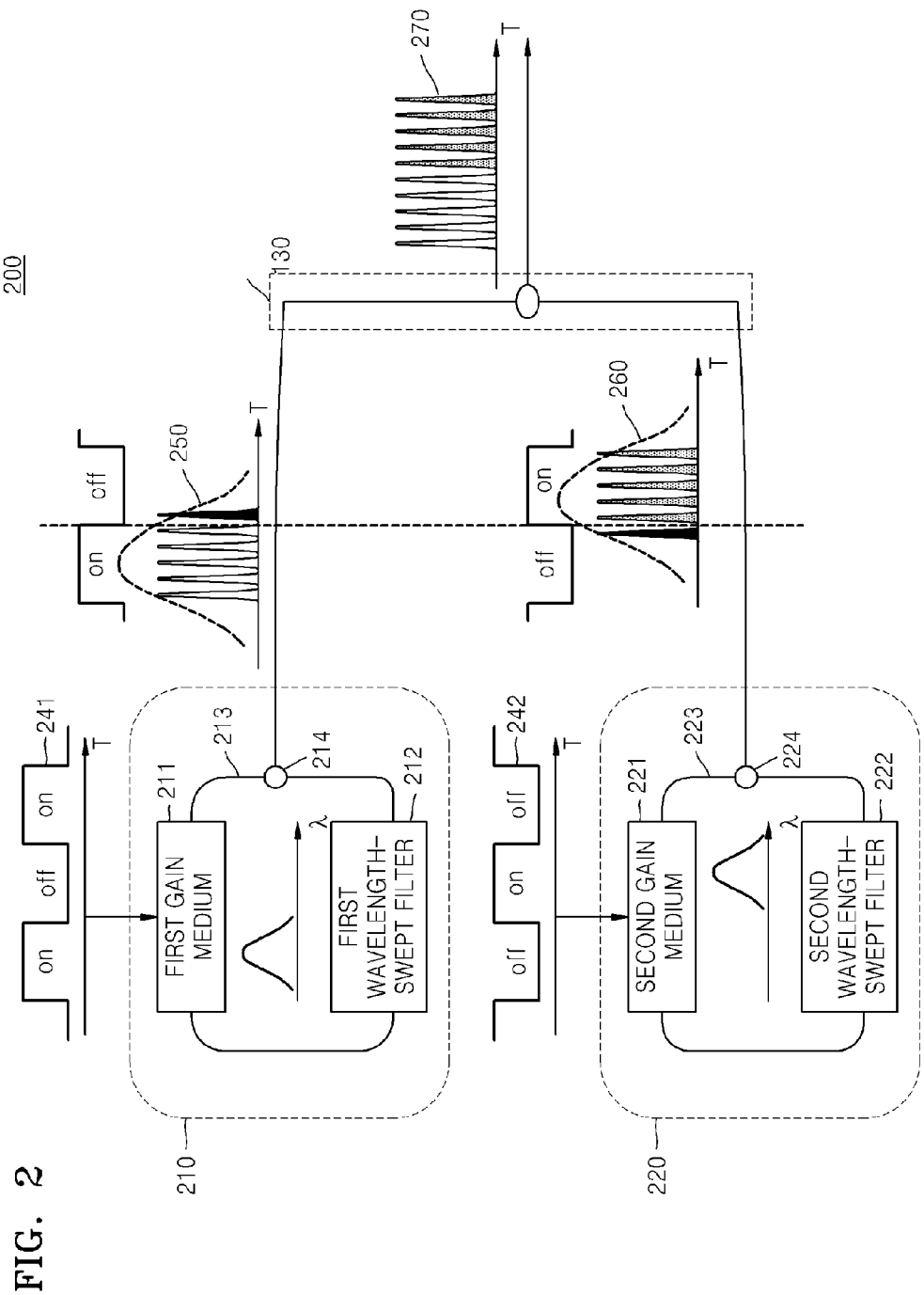
FIG. 2 is a block diagram of another example of a light emission apparatus.

FIG. 2 is a block diagram of another example of a light emission apparatus 200. Referring to FIG. 2, the light emission apparatus 200 includes a first optical generator 210, a second optical generator 220, and a coupling unit 130. The first optical generator 210 includes a first gain medium 211, a first wavelength-swept filter 212, a first optical resonance unit 213, and a first coupler 214, and the second optical generator 220 includes a second gain medium 221, a second wavelength-swept filter 222, a second optical resonance unit 223, and a second coupler 224.

Current signals 241 and 242 shown in FIG. 2 are applied to the first and second gain media 211 and 221 from a controller (not shown), respectively. Although the controller for applying the current signals 241 and 242 is not shown in the light emission apparatus 200 of FIG. 2 to avoid obscuring the features of this example, it will be understood by one of ordinary skill in the art that the controller may be provided inside or outside the light emission apparatus 200 of FIG. 2.

The first optical generator 210 generates first wavelength-swept light using the first gain medium 211, the first wavelength-swept filter 212, the first optical resonance unit 213, and the first coupler 214. Referring to FIG. 2, the first gain medium 211, the first wavelength-swept filter 212, and the first coupler 214 are connected in series to the first optical resonance unit 213.

The first gain medium 211 performs stimulated emission of light within a predetermined wavelength region determined according to characteristics of the first gain medium 211 and amplifies the emitted light. The first gain medium 211 may be an SOA, but is not limited thereto. That is, the first gain medium 211 may include gain media for emitting light of which an intensity and a wavelength region are controlled by an applied current.

The first wavelength-swept filter 212 generates wavelength-swept light having various wavelengths by sweeping wavelengths of the light emitted by the first gain medium 211. For example, the first wavelength-swept filter 212 may be a Fabry-Perot filter or a polygon scanning filter, but is not limited thereto. That is, the first wavelength-swept filter 212 may include wavelength-swept filters for generating wavelength-swept light by sweeping the wavelengths of the light emitted by the first gain medium 211.

The first optical resonance unit 213 resonates and moves the wavelength-swept light generated using the first gain medium 211 and the first wavelength-swept filter 212 to amplify the wavelength-swept light until the wavelength-swept light has a predetermined power. The wavelength-swept light is fed back to the first gain medium 211 by the first optical resonance unit 213, and the feedback wavelength-swept light is amplified again by the first gain medium 211. The first optical generator 210 generates the first wavelength-swept light having the predetermined power by repeating the feedback and the amplification. The first optical resonance unit 213 may include one or more ring cavities.

The first coupler 214 outputs a portion of the first wavelength-swept light generated using the first gain medium 211, the first wavelength-swept filter 212, and the first optical resonance unit 213 to the coupling unit 130 to be coupled with second wavelength-swept light, and feeds the other portion of the first wavelength-swept light back to the first gain medium 211 via the first optical resonance unit 213 to amplify power of the other portion of the first wavelength-swept light. The first coupler 214 may be an optical coupler or a WDM device.

The current signal 241 is applied to the first gain medium 211 by the controller. When the current signal 241 is applied to the first gain medium 211, the first optical generator 210 generates the first wavelength-swept light of which an intensity and a wavelength region have been controlled by the current signal 241. When the current signal 241 is in an on state, the first wavelength-swept light is output in a corresponding wavelength region, and when the current signal 241 is in an off state, the first wavelength-swept light is not output in a corresponding wavelength region. Accordingly, a spectrum 250 of the first wavelength-swept light may be generated as shown in FIG. 2. Referring to the spectrum 250 of FIG. 2, when the current signal 241 is in an off state, the first wavelength-swept light is not output in a corresponding wavelength band of a black part. Accordingly, by adjusting on/off timing of the current signal 241 to be applied by the controller, a wavelength region of the first wavelength-swept light generated by the first optical generator 210 may be determined.

In addition, the light intensity in the spectrum 250 is determined by a magnitude of the current signal 241. Accordingly, by adjusting the magnitude of the current signal 241 to be applied by the controller, an intensity of the first wavelength-swept light generated by the first optical generator 210 may be determined. The spectrum 250 shown in FIG. 2 is merely one example of an optical spectrum that may be generated by the first optical generator 210. The first optical generator 210 may generate spectra of various shapes besides the spectrum 250 shown in FIG. 2 by controlling the current signal 241.

Like the first optical generator 210, in the second optical generator 220, the second gain medium 221, the second wavelength-swept filter 222, and the second coupler 224 are connected in series to the second optical resonance unit 223. Since the second gain medium 221, the second wavelength-swept filter 222, the second optical resonance unit 223, and the second coupler 224 of the second optical generator 220 operate the same as the first gain medium 211, the first wavelength-swept filter 212, the first optical resonance unit 213, and the first coupler 214 of the first optical generator 210, respectively, a description thereof will not be repeated.

A wavelength region and a center wavelength of second wavelength-swept light generated by the second optical generator 220 are determined according to characteristics of the second gain medium 221. By using a gain medium having different characteristics that those of the first gain medium 211 as the second gain medium 221, the center wavelength of the second wavelength-swept light is different from that of the first wavelength-swept light generated by the first optical generator 210. For example, the first gain medium 211 may be a quantum dot SOA of which a center wavelength is 1.2-μm, and the second gain medium 221 may be a quantum well SOA of which a center wavelength is 1.3-μm, but the first gain medium 211 and the second gain medium 221 are not limited thereto.

The current signal 242 is applied to the second gain medium 221 by the controller. The second optical generator 220 generates the second wavelength-swept light of which an intensity and a wavelength region have been controlled by the current signal 242. Like the first wavelength-swept light, when the current signal 242 is in an on state, the second wavelength-swept light is output in a corresponding wavelength region, and when the current signal 242 is in an off state, the second wavelength-swept light is not output in a corresponding wavelength region.

Referring to a spectrum 260 of FIG. 2, when the current signal 242 is in an off state, the second wavelength-swept light 242 is not output in a corresponding wavelength band of a black part. Accordingly, like the first wavelength-swept light, by adjusting on/off timing of the current signal 242 to be applied by the controller, a wavelength region of the second wavelength-swept light generated by the second optical generator 220 may be determined. In addition, by adjusting the magnitude of the current signal 242 to be applied by the controller, an intensity of the second wavelength-swept light may also be determined. The spectrum 260 shown in FIG. 2 is merely one example of an optical spectrum that may be generated by the second optical generator 220, and spectra of various shapes besides the spectrum 260 may be generated.

The coupling unit 130 outputs an output wavelength-swept light by coupling the first wavelength-swept light generated by the first optical generator 210 and the second wavelength-swept light generated by the second optical generator 220. Accordingly, a spectrum 270 of the output wavelength-swept light shown in FIG. 2 may be generated. Since the description related to the coupling unit 130 of FIG. 1 is also applicable to the coupling unit 130 shown in FIG. 2, a description thereof will not be repeated.

Referring to FIG. 2, the spectrum 270 is obtained by coupling the first wavelength-swept light and the second wavelength-swept light in wavelength regions remaining by excluding the corresponding wavelength regions of the black parts when the current signals 241 and 242 are in the off state. Accordingly, when one broadband wavelength-swept light is generated by coupling two or more wavelength-swept lights having different wavelength regions, on/off timings of currents to be applied to gain media of optical generators may be controlled so that the wavelength regions of the wavelength-swept lights do not overlap each other. Accordingly, intensity noise occurring due to overlapping of the wavelength regions of the wavelength-swept lights may be removed to thereby generate wavelength-swept light of a wide wavelength region and a narrow linewidth. Referring to the spectrum 270, a bandwidth of the output wavelength-swept light output from the coupling unit 130 is much wider bandwidth than a bandwidth of the first wavelength-swept light generated by the first optical generator 210 or a bandwidth of the second wavelength-swept light generated by the second optical generator 220.

In addition, by controlling on/off timings and magnitudes of the current signals 241 and 242 to be applied by the controller, a spectral shape of the output wavelength-swept light generated by the light emission apparatus 200 is a Gaussian shape. For example, the light emission apparatus 200 may control the current signals 241 and 242 so that a spectrum of the output wavelength-swept light has a Gaussian shape. The spectrum 270 shown in FIG. 2 is merely one example of an optical spectrum that may be generated by the light emission apparatus 200. The light emission apparatus 200 may generate spectra of various shapes including a Gaussian shape besides the spectrum 270 shown in FIG. 2 by controlling the current signals 241 and 242.

Figure 3:
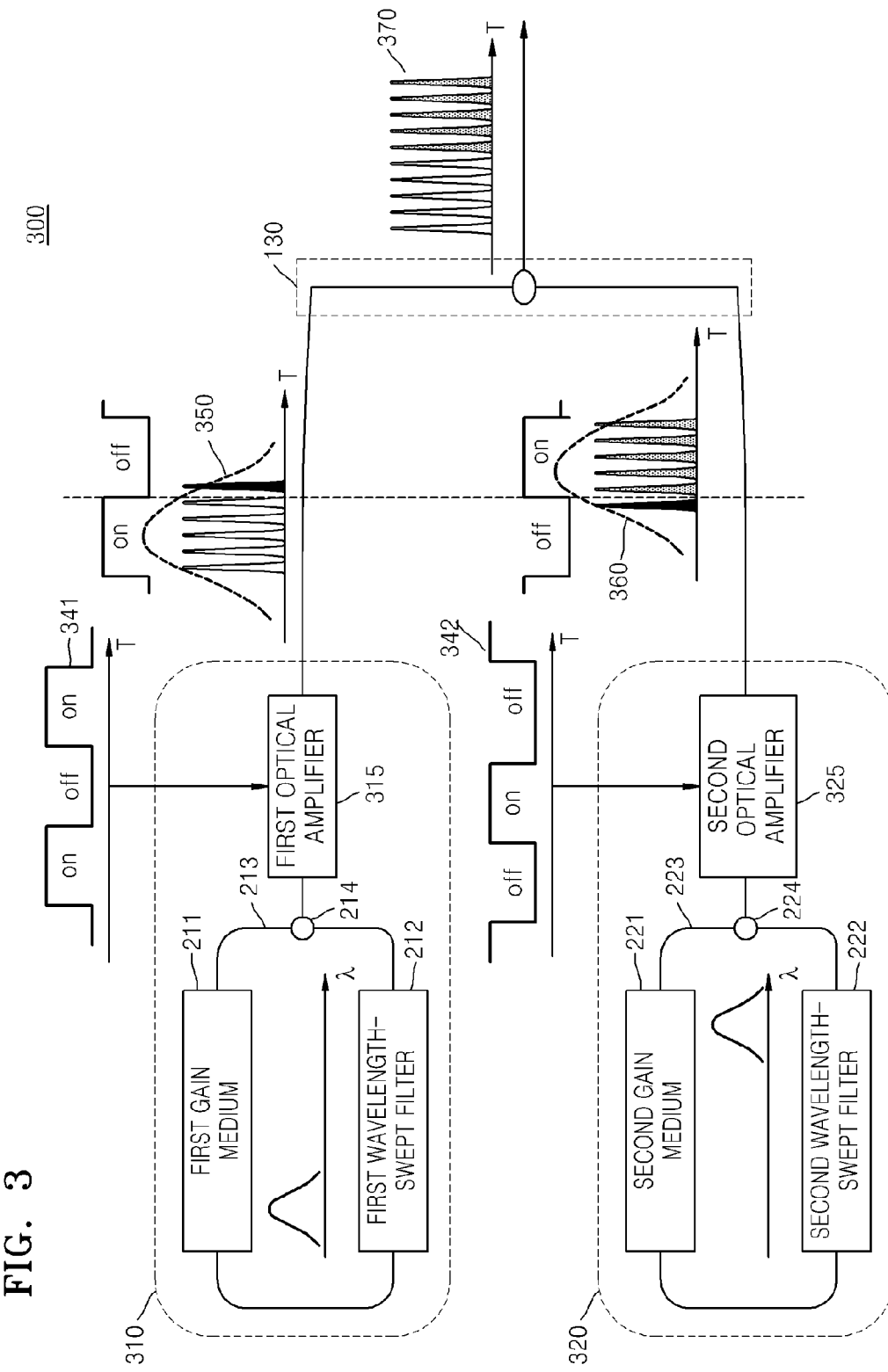
FIG. 3 is a block diagram of another example of a light emission apparatus.

FIG. 3 is a block diagram of another example of a light emission apparatus 300. Referring to FIG. 3, the light emission apparatus 300 includes a first optical generator 310, a second optical generator 320, and a coupling unit 130. The first optical generator 310 includes a first gain medium 211, a first wavelength-swept filter 212, a first optical resonance unit 213, a first coupler 214, and a first optical amplifier 315, and the second optical generator 320 includes a second gain medium 221, a second wavelength-swept filter 222, a second optical resonance unit 223, a second coupler 224, and a second optical amplifier 325. Current signals 341 and 342 shown in FIG. 3 are applied to the first and second optical amplifiers 315 and 325 by a controller (not shown), respectively.

Since the first gain medium 211, the first wavelength-swept filter 212, the first optical resonance unit 213, the first coupler 214, the second gain medium 221, the second wavelength-swept filter 222, the second optical resonance unit 223, and the second coupler 224 shown in FIG. 3 correspond to the first gain medium 211, the first wavelength-swept filter 212, the first optical resonance unit 213, the first coupler 214, the second gain medium 221, the second wavelength-swept filter 222, the second optical resonance unit 223, and the second coupler 224 shown in FIG. 2, respectively, a description thereof will not be repeated.

Although the controller for applying the current signals 341 and 342 is not shown in the light emission apparatus 300 of FIG. 3 to avoid obscuring the features of this example, it will be understood by one of ordinary skill in the art that the controller may be provided inside or outside the light emission apparatus 300 of FIG. 3.

The first optical amplifier 315 amplifies wavelength-swept light generated using the first gain medium 211, the first wavelength-swept filter 212, and the first optical resonance unit 213. The first optical amplifier 315 may be an SOA, but is not limited thereto. That is, the first optical amplifier 315 may include optical amplifiers for controlling an intensity and a wavelength region of emitted light by an applied current.

The first optical generator 310 generates first wavelength-swept light by using the first optical amplifier 315 to amplify wavelength-swept light generated using the first gain medium 211, the first wavelength-swept filter 212, and the first optical resonance unit 213.

Referring to FIG. 3, the first gain medium 211, the first wavelength-swept filter 212, and the first coupler 214 are connected in series to the first optical resonance unit 213. The first optical amplifier 315 is located outside a loop consisting of the first gain medium 211, the first wavelength-swept filter 212, the first optical resonance unit 213, and the first coupler 214 that are connected in series. Accordingly, in the first optical generator 310, the wavelength-swept light generated using the first gain medium 211, the first wavelength-swept filter 212, and the first optical resonance unit 213 is output to the first optical amplifier 315 via the first coupler 214 without being fed back to the first gain medium 211, and is amplified by the first optical amplifier 315 to be output as the first wavelength-swept light.

Unlike the light emission apparatus 200 of FIG. 2, in the light emission apparatus 300 of FIG. 3, the current signal 341 is applied to the first optical amplifier 315. The light emission apparatus 300 of FIG. 3 controls an intensity and a wavelength region of the first wavelength-swept light by controlling either one or both of a magnitude and an on/off timing of a current to be applied to the first optical amplifier 315 instead of the first gain medium 211. When the current signal 341 is applied to the first optical amplifier 315, the first optical generator 310 generates the first wavelength-swept light of which an intensity and a wavelength region have been controlled by the current signal 341. According to the current signal 341 to be applied by the controller, the first wavelength-swept light generated by the first optical generator 310 may have an optical spectrum having a shape of a spectrum 350 shown in FIG. 3. The spectrum 350 shown in FIG. 3 is merely one example of an optical spectrum that may be generated by the first optical generator 310.

The second optical amplifier 325 amplifies wavelength-swept light generated using the second gain medium 221, the second wavelength-swept filter 222, and the second optical resonance unit 223. Like the first optical amplifier 315, the second optical amplifier 325 may be an SOA, but is not limited thereto.

The second optical generator 320 generates second wavelength-swept light by using the second optical amplifier 325 to amplify wavelength-swept light generated using the second gain medium 221, the second wavelength-swept filter 222, and the second optical resonance unit 223. The second optical generator 320 generates the second wavelength-swept light having a different center wavelength from that of the first wavelength-swept light generated by the first optical generator 310. Like the first optical generator 310, in the second optical generator 320, the second gain medium 221, the second wavelength-swept filter 222, and the second coupler 224 are connected in series to the second optical resonance unit 223. The second optical amplifier 325 is also located outside a loop consisting of the second gain medium 221, the second wavelength-swept filter 222, the second optical resonance unit 223, and the second coupler 224 that are connected in series.

In the light emission apparatus 300, the current signal 342 is applied to the second optical amplifier 325 by the controller. The light emission apparatus 300 of FIG. 3 controls an intensity and a wavelength region of the second wavelength-swept light by controlling either one or both of a magnitude and an on/off timing of a current to be applied to the second optical amplifier 325 instead of the second gain medium 221. When the current signal 342 is applied to the second optical amplifier 325, the second optical generator 320 generates the second wavelength-swept light of which an intensity and a wavelength region have been controlled by the current signal 342. According to the current signal 342 to be applied by the controller, the second wavelength-swept light generated by the second optical generator 320 may have an optical spectrum having a shape of a spectrum 360 shown in FIG. 3. The spectrum 360 shown in FIG. 3 is merely one example of an optical spectrum that may be generated by the second optical generator 320.

The coupling unit 130 outputs an output wavelength-swept light by coupling the first wavelength-swept light generated by the first optical generator 310 and the second wavelength-swept light generated by the second optical generator 320. Accordingly, a spectrum 370 of the output wavelength-swept light shown in FIG. 3 may be generated. Since the description related to the coupling unit 130 of FIGS. 1 and 2 is also applicable to the coupling unit 130 shown in FIG. 3, a description thereof will not be repeated.

Referring to FIG. 3, the spectrum 370 is obtained by coupling the first wavelength-swept light and the second wavelength-swept light in wavelength regions remaining by excluding the corresponding wavelength regions of the black parts when the current signals 341 and 342 are in the off state. Accordingly, on/off timings of currents to be applied to gain media of optical generators for generating wavelength-swept lights may be controlled so that wavelength regions of the wavelength-swept lights do not overlap each other. The light emission apparatus 300 may generate spectra of various shapes besides the spectrum 370 shown in FIG. 3 by controlling the current signals 341 and 342. For example, the light emission apparatus 300 may control on/off timings and magnitudes of the current signals 341 and 342 so that a spectrum of the output wavelength-swept light has a Gaussian shape.

The controller may control an intensity and a wavelength region of each of the first wavelength-swept light and the second wavelength-swept light by controlling either one or both of a magnitude and an on/off timing of a current to be applied to each of the first optical amplifier 315 and the second optical amplifier 325.

Figure 4:
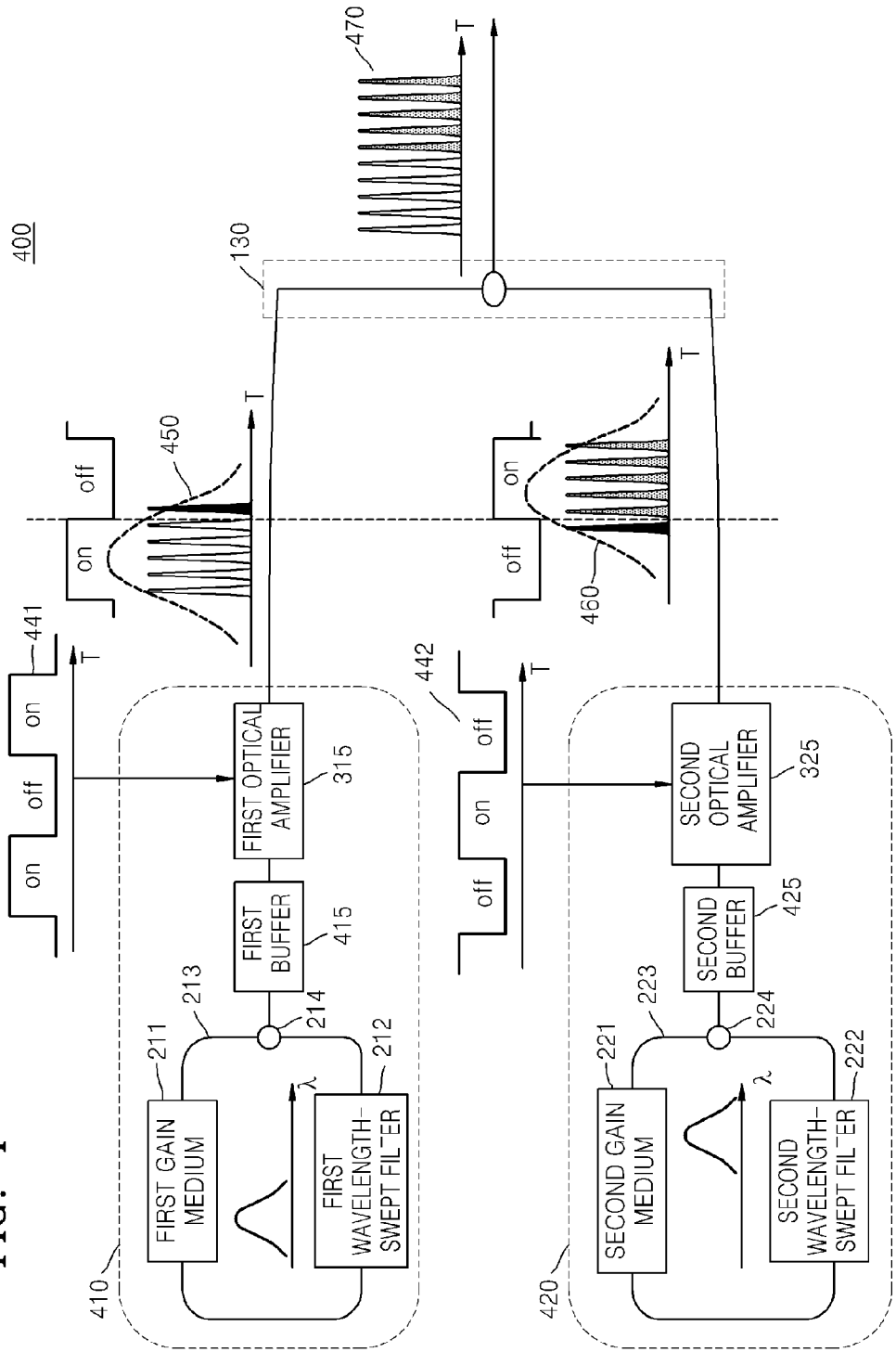
FIG. 4 is a block diagram of another example of a light emission apparatus.

FIG. 4 is a block diagram of another example of a light emission apparatus 400. Referring to FIG. 4, the light emission apparatus 400 includes a first optical generator 410, a second optical generator 420, and a coupling unit 130. The first optical generator 410 includes a first gain medium 211, a first wavelength-swept filter 212, a first optical resonance unit 213, a first coupler 214, a first optical amplifier 315, and a first buffer 415, and the second optical generator 420 includes a second gain medium 221, a second wavelength-swept filter 222, a second optical resonance unit 223, a second coupler 224, a second optical amplifier 325, and a second buffer 425. Current signals 441 and 442 shown in FIG. 4 are applied to the first and second optical amplifiers 315 and 325 by a controller (not shown), respectively.

Since the first gain medium 211, the first wavelength-swept filter 212, the first optical resonance unit 213, the first coupler 214, the second gain medium 221, the second wavelength-swept filter 222, the second optical resonance unit 223, and the second coupler 224 shown in FIG. 4 correspond to the first gain medium 211, the first wavelength-swept filter 212, the first optical resonance unit 213, the first coupler 214, the second gain medium 221, the second wavelength-swept filter 222, the second optical resonance unit 223, and the second coupler 224 shown in FIG. 2, respectively, a description thereof will not be repeated.

Although the controller for applying the current signals 441 and 442 is not shown in the light emission apparatus 400 of FIG. 4 to avoid obscuring the features of this example, it will be understood by one of ordinary skill in the art that the controller may be provided inside or outside the light emission apparatus 400 of FIG. 4.

The first optical amplifier 315 amplifies wavelength-swept light generated using the first gain medium 211, the first wavelength-swept filter 212, and the first optical resonance unit 213. In greater detail, the first optical amplifier 315 amplifies wavelength-swept light obtained by coupling the wavelength-swept light generated using the first gain medium 211, the first wavelength-swept filter 212, and the first optical resonance unit 213, and at least one wavelength-swept light stored in the first buffer 415.

The first buffer 415 stores wavelength-swept light generated using the first gain medium 211, the first wavelength-swept filter 212, and the first optical resonance unit 213. The first buffer 415 may be implemented using an optical coupler, for example.

For example, the first buffer 415 stores third wavelength-swept light generated using the first gain medium 211, the first wavelength-swept filter 212, and the first optical resonance unit 213. The first buffer 415 may output, to the first optical amplifier 315, one wavelength-swept light obtained by coupling fifth wavelength-swept light which is generated using the first gain medium 211, the first wavelength-swept filter 212, and the first optical resonance unit 213 after a first time elapses since the third wavelength-swept light was generated, and the third wavelength-swept light stored in the first buffer 415. The third wavelength-swept light is light having wavelengths swept in a third wavelength region among light wavelength regions that may be generated by the first gain medium 211, and the fifth wavelength-swept light is wavelength-swept light generated after the first time since the third wavelength-swept light was generated, i.e., light having wavelengths swept in a fifth wavelength region other than the third wavelength region.

Accordingly, in the first optical generator 410, when the fifth wavelength-swept light generated using the first gain medium 211, the first wavelength-swept filter 212, and the first optical resonance unit 213 is output to the first buffer 415 via the first coupler 214 without being fed back to the first gain medium 211, the first optical generator 410 may generate first wavelength-swept light by coupling the fifth wavelength-swept light and the third wavelength-swept light stored in the first buffer 415 and amplifying the coupled wavelength-swept light using the first optical amplifier 315.

Referring to FIG. 4, in the light emission apparatus 400, the first gain medium 211, the first wavelength-swept filter 212, and the first coupler 214 are connected in series to the first optical resonance unit 213. The first buffer 415 and the first optical amplifier 315 are connected in series and are located outside a loop consisting of the first gain medium 211, the first wavelength-swept filter 212, the first optical resonance unit 213, and the first coupler 214 that are connected in series.

Like the light emission apparatus 300 of FIG. 3, in the light emission apparatus 400 of FIG. 4, the current signal 441 is applied to the first optical amplifier 315. Accordingly, the first optical generator 410 may generate the first wavelength-swept light of which an intensity and a wavelength region have been controlled by the current signal 441. The first wavelength-swept light may have an optical spectrum having a shape of a spectrum 450 shown in FIG. 4. The spectrum 450 shown in FIG. 4 is merely one example of an optical spectrum that may be generated by the first optical generator 410.

The second optical amplifier 325 amplifies wavelength-swept light generated using the second gain medium 221, the second wavelength-swept filter 222, and the second optical resonance unit 223. In greater detail, the second optical amplifier 325 amplifies wavelength-swept light obtained by coupling the wavelength-swept light, which is generated using the second gain medium 221, the second wavelength-swept filter 222, and the second optical resonance unit 223, and at least one wavelength-swept light stored in the second buffer 425.

The second buffer 425 stores wavelength-swept light generated using the second gain medium 221, the second wavelength-swept filter 222, and the second optical resonance unit 223. For example, the second buffer 425 may be implemented using an optical coupler and so forth.

For example, the second buffer 425 stores fourth wavelength-swept light generated using the second gain medium 221, the second wavelength-swept filter 222, and the second optical resonance unit 223. The second optical amplifier 325 may amplify wavelength-swept light obtained by coupling sixth wavelength-swept light, which is generated using the second gain medium 221, the second wavelength-swept filter 222, and the second optical resonance unit 223, and the fourth wavelength-swept light stored in the second buffer 425. The fourth wavelength-swept light is light having wavelengths swept in a fourth wavelength region among light wavelength regions that may be generated by the second gain medium 221, and the sixth wavelength-swept light is wavelength-swept light generated after a second time since the fourth wavelength-swept light was generated, i.e., light having wavelengths swept in a sixth wavelength region other than the fourth wavelength region.

Referring to FIG. 4, like the first optical generator 410, in the second optical generator 420, the second gain medium 221, the second wavelength-swept filter 222, and the second coupler 224 are connected in series to the second optical resonance unit 223. The second buffer 425 and the second optical amplifier 325 are connected in series and are located outside a loop consisting of the second gain medium 221, the second wavelength-swept filter 222, the second optical resonance unit 223, and the second coupler 224 that are connected in series.

Like the first optical generator 410, the current signal 442 is applied to the second optical amplifier 325. Accordingly, the second optical generator 420 may generate second wavelength-swept light of which an intensity and a wavelength region have been controlled by the current signal 442. The second wavelength-swept light may have an optical spectrum having a shape of a spectrum 460 shown in FIG. 4. The spectrum 460 shown in FIG. 4 is merely one example of an optical spectrum that may be generated by the second optical generator 420.

The coupling unit 130 outputs an output wavelength-swept light by coupling the first wavelength-swept light generated by the first optical generator 410 and the second wavelength-swept light generated by the second optical generator 420. Accordingly, a spectrum 470 of the output wavelength-swept light shown in FIG. 4 may be generated. Since the description related to the coupling unit 130 of FIGS. 1 to 3 is also applicable to the coupling unit 130 shown in FIG. 4, a description thereof will not be repeated.

The controller may control an intensity and a wavelength region of each of the first wavelength-swept light and the second wavelength-swept light by controlling either one or both of a magnitude and an on/off timing of a current to be applied to each of the first optical amplifier 315 and the second optical amplifier 325.

Accordingly, the light emission apparatus 400 may compensate for a coupling loss occurring in a process of coupling generated wavelength-swept light and stored wavelength-swept light by controlling a wavelength region and power of wavelength-swept light through a current control of an optical amplifier after coupling the coupling generated wavelength-swept light and the stored wavelength-swept light.

Figure 5:
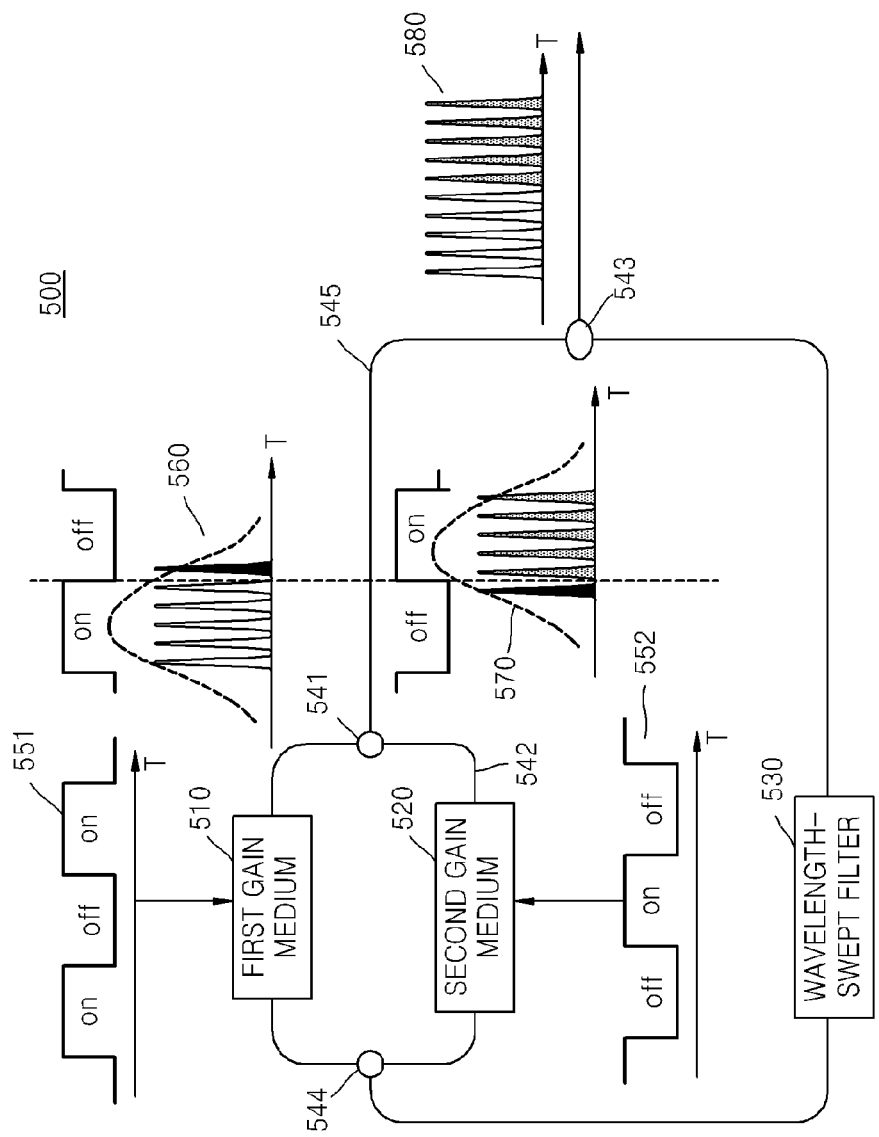
FIG. 5 is a block diagram of another example of a light emission apparatus.

FIG. 5 is a block diagram of another example of a light emission apparatus 500. Referring to FIG. 5, the light emission apparatus 500 includes a first gain medium 510, a second gain medium 520, a wavelength-swept filter 530, a first coupler 541, a first optical resonance unit 542, a second coupler 543, a third coupler 544, and a second optical resonance unit 545. Current signals 551 and 552 shown in FIG. 5 are applied to the first and second gain media 510 and 520 by a controller (not shown), respectively.

Although the controller for applying the current signals 551 and 552 is not shown in the light emission apparatus 500 to avoid obscuring the features of this example, it will be understood by one of ordinary skill in the art that the controller may be provided inside or outside the light emission apparatus 500 of FIG. 5.

The light emission apparatus 500 generates first wavelength-swept light using the first gain medium 510, the wavelength-swept filter 530, the first coupler 541, the first optical resonance unit 542, the second coupler 543, the third coupler 544, and the second optical resonance unit 545. The components of the light emission apparatus 500 for generating the first wavelength-swept light may form a first optical generator (not shown).

The light emission apparatus 500 generates second wavelength-swept light using the second gain medium 520, the wavelength-swept filter 530, the first coupler 541, the first optical resonance unit 542, the second coupler 543, the third coupler 544, and the second optical resonance unit 545. The components of the light emission apparatus 500 for generating the second wavelength-swept light may form a second optical generator (not shown).

In this example, the first gain medium 510 and the second gain medium 520 are connected in parallel by the first optical resonance unit 542. The first optical resonance unit 542 and the wavelength-swept filter 530 are connected in series to the second optical resonance unit 545 so that each of the first gain medium 510 and the second gain medium 520 is connected in series to the wavelength-swept filter 530.

The first gain medium 510 emits light having a first center wavelength using stimulated emission and amplification of light. The second gain medium 520 emits light having a second center wavelength other than the first center wavelength using stimulated emission and amplification of light. For example, each of the first gain medium 510 and the second gain medium 520 may be an SOA, but are not limited thereto.

The wavelength-swept filter 530 sweeps wavelengths of the lights emitted by the first gain medium 510 and the second gain medium 520. That is, the wavelength-swept filter 530 generates wavelength-swept lights having various wavelengths by sweeping the wavelengths of the lights emitted by the first gain medium 510 and the second gain medium 520. For example, the wavelength-swept filter 530 may be a Fabry-Perot filter or a polygon scanning filter, but is not limited thereto.

The first optical resonance unit 542 resonates and moves the lights emitted by the first gain medium 510 and the second gain medium 520. For example, the first optical resonance unit 542 may include at least one ring cavity.

The second optical resonance unit 545 feeds the wavelength-swept light swept by the wavelength-swept filter 530 back to the first gain medium 510 and the second gain medium 520. Accordingly, the second optical resonance unit 545 amplifies wavelength-swept light generated using the first gain medium 510, the second gain medium 520, and the wavelength-swept filter 530 until the generated wavelength-swept light has a predetermined power. For example, the second optical resonance unit 545 may include at least one ring cavity.

The first coupler 541 outputs the light emitted by the first gain medium 510 or the second gain medium 520 to the second optical resonance unit 545. For example, the first coupler 541 may be an optical coupler.

The second coupler 543 outputs an output wavelength-swept light obtained by coupling first wavelength-swept light generated by the first gain medium 510 and second wavelength-swept light generated by the second gain medium 520. In this case, the second coupler 543 corresponds to the coupling unit 130 shown in FIG. 1. The second coupler 543 outputs a portion of the output wavelength-swept light to the outside of the light emission apparatus 500 or feeds the portion of the output wavelength-swept light back to the first gain medium 510 or the second gain medium 520 via the second optical resonance unit 545 to amplify a power of the output wavelength-swept light. For example, the second coupler 543 may be an optical coupler or a WDM device.

The third coupler 544 outputs wavelength-swept lights swept by the wavelength-swept filter 530 to the first optical resonance unit 542 so that the wavelength-swept lights swept by the wavelength-swept filter 530 are fed back to the first gain medium 510 or the second gain medium 520. For example, the third coupler 544 may be an optical coupler.

The controller controls an intensity and a wavelength region of each of the first wavelength-swept light and the second wavelength-swept light by controlling either one or both of a magnitude and an on/off timing of a current to be applied to each of the first gain medium 510 and the second gain medium 520.

In the light emission apparatus 500, the current signals 551 and 552 are applied to the first gain medium 510 and the second gain medium 520, respectively. Accordingly, the light emission apparatus 500 generates the first wavelength-swept light and the second wavelength-swept light of which intensities and wavelength regions have been controlled by the current signals 551 and 552. For example, the first wavelength-swept light and the second wavelength-swept light may have optical spectra having shapes of spectra 560 and 570 shown in FIG. 5, respectively. The light emission apparatus 500 may generate an optical spectrum of the output wavelength-swept light, such as a spectrum 580, by coupling the first wavelength-swept light and the second wavelength-swept light of which intensities and wavelength regions have been controlled.

In one example, the light emission apparatus 500 may further include at least one gain medium for emitting light having a center wavelength other than the first center wavelength and the second center wavelength using stimulated emission and amplification of light. Accordingly, the coupling unit 130 may output an output wavelength-swept light by coupling the first wavelength-swept light, the second wavelength-swept light, and the wavelength-swept light generated by the at least one gain medium, and the controller may output the output wavelength-swept light by coupling the first wavelength-swept light, the second wavelength-swept light, and the wavelength-swept light generated by the at least one gain medium of which intensities and wavelength regions have been controlled by controlling either one or both of a magnitude and an on/off timing of a current to be applied to each of the first gain medium 510, the second gain medium 520, and the at least one gain medium.

Figure 6:
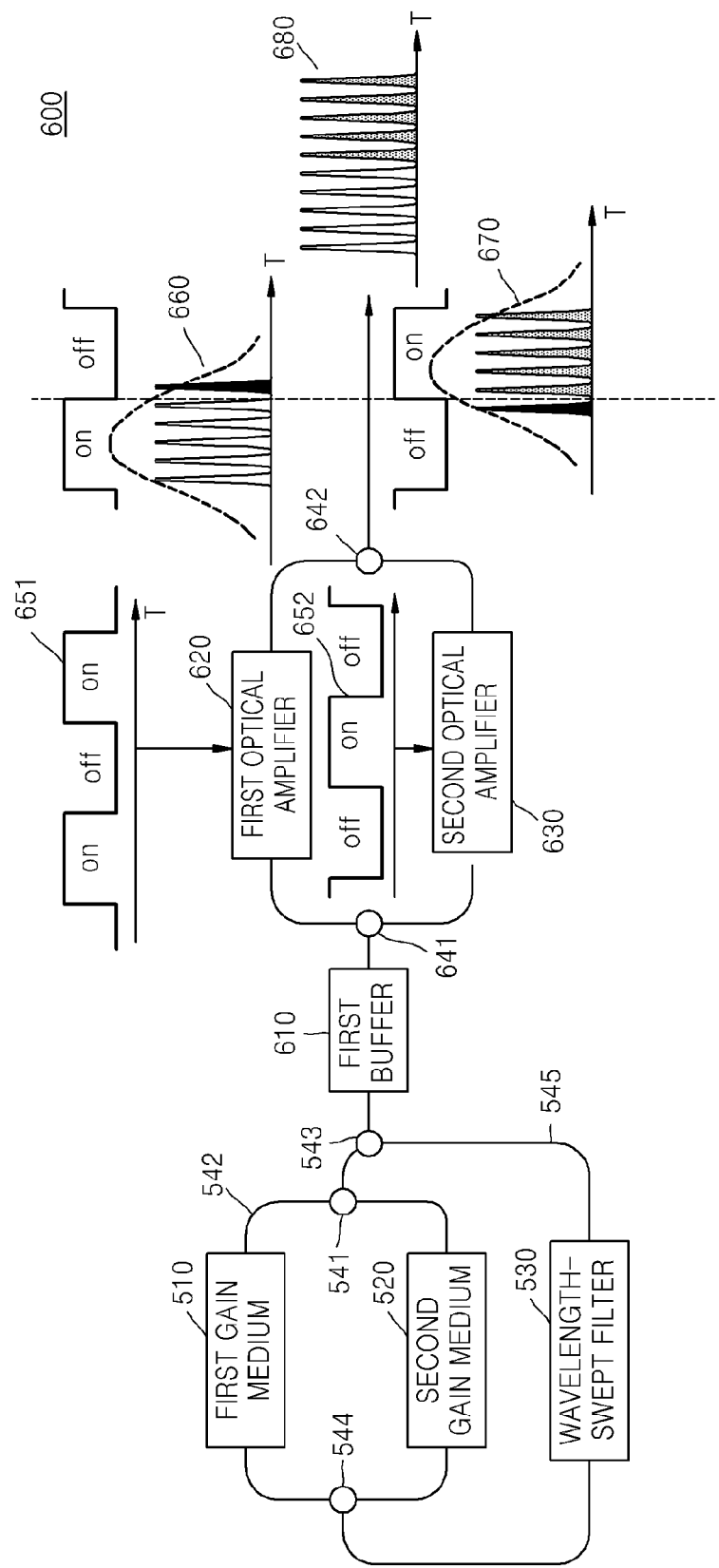
FIG. 6 is a block diagram of another example of a light emission apparatus.

FIG. 6 is a block diagram of another example of a light emission apparatus 600. Referring to FIG. 6, the light emission apparatus 600 includes a first gain medium 510, a second gain medium 520, a wavelength-swept filter 530, a first coupler 541, a first optical resonance unit 542, a second coupler 543, a third coupler 544, a second optical resonance unit 545, a first buffer 610, a first optical amplifier 620, a second optical amplifier 630, a fourth coupler 641, and a fifth coupler 642. Current signals 651 and 652 shown in FIG. 6 are applied to the first and second optical amplifiers 620 and 630 by a controller (not shown), respectively.

Since the first gain medium 510, the second gain medium 520, the wavelength-swept filter 530, the first coupler 541, the first optical resonance unit 542, the third coupler 544, and the second optical resonance unit 545 shown in FIG. 6 correspond to the first gain medium 510, the second gain medium 520, the wavelength-swept filter 530, the first coupler 541, the first optical resonance unit 542, the third coupler 544, and the second optical resonance unit 545 shown in FIG. 5, respectively, a description thereof will not be repeated.

Although the controller for applying the current signals 651 and 652 is not shown in the light emission apparatus 600 to avoid obscuring the features of this example, it will be understood by one of ordinary skill in the art that the controller may be provided inside or outside the light emission apparatus 600 of FIG. 6.

The second coupler 543 outputs one wavelength-swept light obtained by coupling wavelength-swept light generated by the first gain medium 510 and wavelength-swept light generated by the second gain medium 520. The second coupler 543 outputs a portion of the coupled wavelength-swept light to the outside of the light emission apparatus 600 or feeds the portion of the coupled wavelength-swept light back to the first gain medium 510 or the second gain medium 520 via the second optical resonance unit 545 to amplify power of the coupled wavelength-swept light.

The first buffer 610 stores wavelength-swept lights generated using the wavelength-swept filter 530, the first optical resonance unit 542, the second optical resonance unit 545, and either one of the first gain medium 510 and the second gain medium 520. The first buffer 610 outputs wavelength-swept light by coupling the third wavelength-swept lights generated using the wavelength-swept filter 530, the first optical resonance unit 542, the second optical resonance unit 545, and either one of the first gain medium 510 and the second gain medium 520 and swept in a wavelength region other than those of the stored wavelength-swept lights, and the stored wavelength-swept lights.

The fourth coupler 641 splits the wavelength-swept light output from the first buffer 610 into wavelength-swept light generated using the first gain medium 510 and wavelength-swept light generated using the second gain medium 520 and outputs the split wavelength-swept lights to the first and second optical amplifiers 620 and 630, respectively. The fourth coupler 641 may be an optical coupler.

The first optical amplifier 620 generates first wavelength-swept light by amplifying the wavelength-swept light generated using the first gain medium 510 among the wavelength-swept light output from the first buffer 610. In this case, the first optical amplifier 620 may be an SOA, but is not limited thereto.

The second optical amplifier 630 generates second wavelength-swept light by amplifying the wavelength-swept light generated using the second gain medium 520 among the wavelength-swept light output from the first buffer 610. In this case, like the first optical amplifier 620, the second optical amplifier 630 may be an SOA, but is not limited thereto.

The fifth coupler 642 outputs an output wavelength-swept light by coupling the first wavelength-swept light output from the first optical amplifier 620 and the second wavelength-swept light output from the second optical amplifier 630. In this case, the fifth coupler 642 corresponds to the coupling unit 130 shown in FIG. 1. The fifth coupler 642 may be implemented using an optical coupler or a WDM device.

The light emission apparatus 600 generates the first wavelength-swept light by coupling wavelength-swept lights generated using the first gain medium 510, using the first buffer 610 and amplifying the coupled wavelength-swept light using the first optical amplifier 620. In this case, the components of the light emission apparatus 600 for generating the first wavelength-swept light may form a first optical generator (not shown).

The light emission apparatus 600 generates the second wavelength-swept light by coupling wavelength-swept lights generated using the second gain medium 520, using the first buffer 610 and amplifying the coupled wavelength-swept light using the second optical amplifier 630. In this case, the components of the light emission apparatus 600 for generating the second wavelength-swept light may form a second optical generator (not shown).

Referring to FIG. 6, the first gain medium 510 and the second gain medium 520 are connected in parallel by the first optical resonance unit 542, and the first optical resonance unit 542 and the wavelength-swept filter 530 are connected in series to the second optical resonance unit 545, and thus, each of the first gain medium 510 and the second gain medium 520 is connected in series to the wavelength-swept filter 530. The second optical resonance unit 545 is connected in series to the first buffer 610, and the first buffer 610 is connected in series to the first optical amplifier 620 and the second optical amplifier 630 that are connected in parallel.

The controller controls an intensity and a wavelength region of each of the first wavelength-swept light and the second wavelength-swept light by controlling either one or both of a magnitude and an on/off timing of a current to be applied to each of the first optical amplifier 620 and the second optical amplifier 630.

In the light emission apparatus 600, the current signals 651 and 652 are applied to the first optical amplifier 620 and the second optical amplifier 630, respectively. Accordingly, the light emission apparatus 600 generates the first wavelength-swept light and the second wavelength-swept light of which intensities and wavelength regions have been controlled by the current signals 651 and 652. For example, the first wavelength-swept light and the second wavelength-swept light may have optical spectra having shapes of spectra 660 and 670 shown in FIG. 6, respectively. The light emission apparatus 600 may generate an optical spectrum of the output wavelength-swept light, such as a spectrum 680, by coupling the first wavelength-swept light and the second wavelength-swept light of which intensities and wavelength regions have been controlled.

Figure 7A:
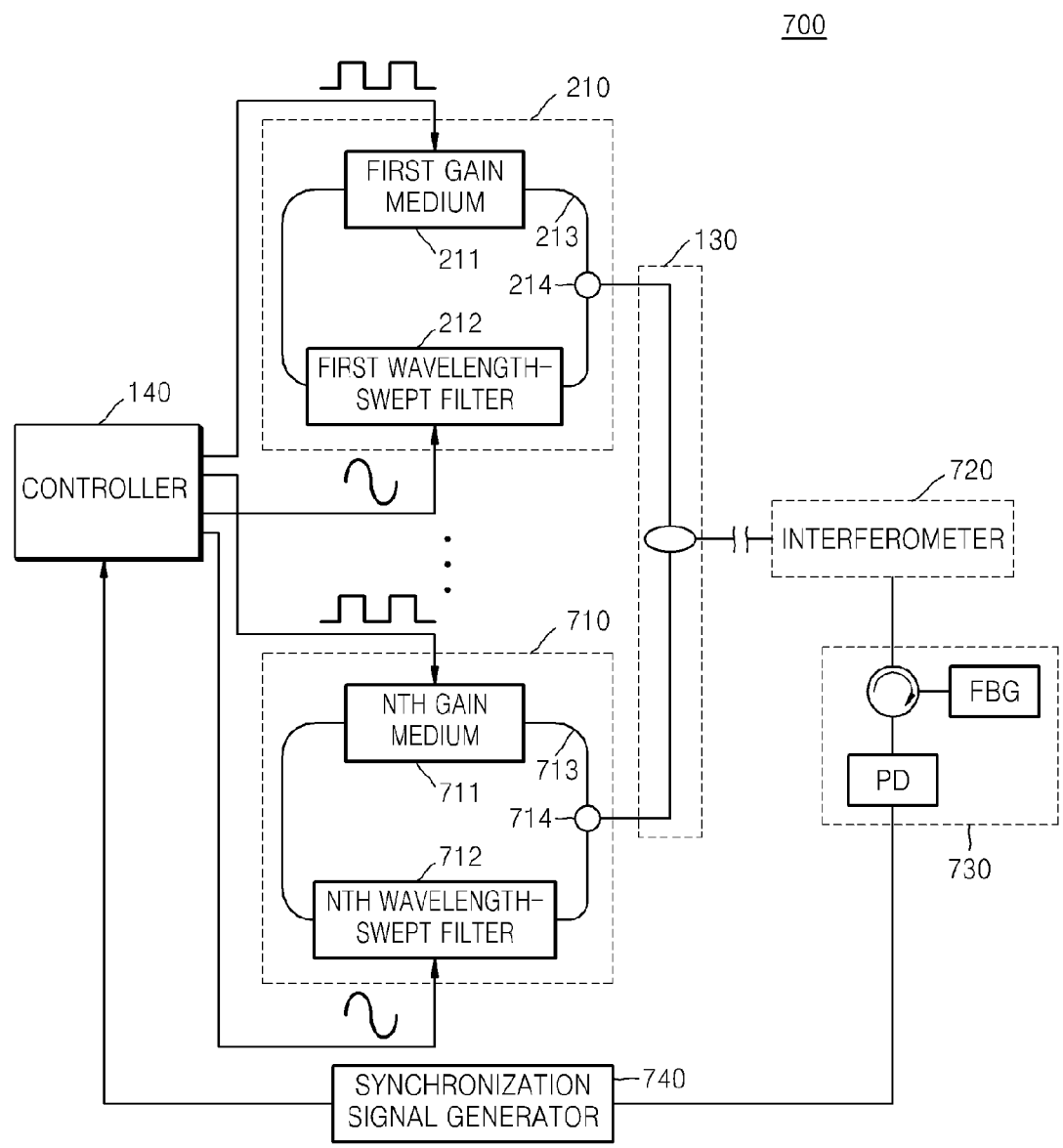
FIG. 7A is a block diagram for describing an example of an operation of a controller of the light emission apparatus of FIG. 1 to control one or more optical generators.

FIG. 7A is a block diagram for describing an example of an operation of the controller 140 shown in FIG. 1 to control one or more optical generators. Referring to FIG. 7A, a light emission apparatus 700 includes a first optical generator 210 to an Nth optical generator 710, a coupling unit 130, and the controller 140. The light emission apparatus 700 further includes an optical signal extractor 730 and a synchronization signal generator 740.

For the light emission apparatus 700, only components associated with this example are shown in FIG. 7A to prevent the features of this example from being obscured. Thus, it will be understood by one of ordinary skill in the art that other general-use components may be provided in addition to the components shown in FIG. 7A. Since the coupling unit 130 and the controller 140 shown in FIG. 7A correspond to the coupling unit 130 and the controller 140 shown in FIG. 1, a description thereof will not be repeated.

The first optical generator 210 to the Nth optical generator 710 generate first to Nth wavelength-swept lights, respectively. Although the first optical generator 210 to the Nth optical generator 710 shown in FIG. 7 are shown in the form of the first and second optical generators 210 and 220 shown in FIG. 2 for convenience of description, each of the first optical generator 210 to the Nth optical generator 710 shown in FIG. 7 may be implemented in the form of any of the optical generators described with reference to FIGS. 2 to 6. For example, the first optical generator 210 to the Nth optical generator 710 may further include a first optical amplifier (not shown) to an Nth optical amplifier (not shown), respectively, as in the form of either of the first and second optical generators 310 and 320 shown in FIG. 3.

The coupling unit 130 outputs an output wavelength-swept light by coupling the first to Nth wavelength-swept lights generated by the first optical generator 210 to the Nth optical generator 710.

The optical signal extractor 730 extracts an optical signal of a predetermined wavelength region from the wavelength-swept light obtained by coupling the first to Nth wavelength-swept lights. For convenience of description, although it is shown that the optical signal extractor 730 extracts an optical signal from the wavelength-swept light obtained by coupling the first to Nth wavelength-swept lights, the optical signal extractor 730 is not limited thereto. The optical signal extractor 730 may extract an optical signal from wavelength-swept light generated by any one of the first optical generator 210 to the Nth optical generator 710, and an example of this is described with reference to FIG. 7B. Although the optical signal extractor 730 may be implemented by a photodiode (PD), a fiber Bragg grating (FBG), and a circulator as shown in FIG. 7A, the optical signal extractor 730 is not limited thereto, and may be implemented by various devices as will be apparent to one of ordinary skill in the art.

The synchronization signal generator 740 generates a synchronization signal for synchronizing an operation of performing stimulated emission and amplification of lights in a first gain medium 211 to an Nth gain medium 711 with an operation of sweeping wavelengths of lights in a first wavelength-swept filter 212 to an Nth wavelength-swept filter 712 based on the extracted optical signal, respectively. The generated synchronization signal may be a transistor-transistor logic (TTL) signal, but is not limited thereto.

The controller 140 controls an intensity and a wavelength region of each of the first to Nth wavelength-swept lights by controlling a current to be applied to each of the first gain medium 211 to the Nth gain medium 711 in the first optical generator 210 to the Nth optical generator 710. In one example, the controller 140 may control operations of the first gain medium 211 to the Nth gain medium 711 and the first wavelength-swept filter 212 to the Nth wavelength-swept filter 712 by generating a current to be applied to each of the first gain medium 211 to the Nth gain medium 711 and a voltage to be applied to each of the first wavelength-swept filter 212 to the Nth wavelength-swept filter 712 based on the synchronization signal.

In another example, when the first optical generator 210 to the Nth optical generator 710 are implemented in the form of the first or second optical generator 310 or 320 shown in FIG. 3, the controller 140 may control operations of the first gain medium 211 to the Nth gain medium 711, the first wavelength-swept filter 212 to the Nth wavelength-swept filter 712, and first to Nth optical amplifiers (not shown) by further generating a current to be applied to each of the first to Nth optical amplifiers based on the synchronization signal.

In the example in FIG. 7A, the light emission apparatus 700 is connected to an interferometer 720. Accordingly, the coupled wavelength-swept light output from the light emission apparatus 700 is input to the interferometer 720. The interferometer 720 splits the coupled wavelength-swept light output from the light emission apparatus 700 into measurement light and reference light and receives response light returned as the measurement light and the reference light are reflected. For example, the optical signal extractor 730 may extract an optical signal from a reference arm of the interferometer 720. The reference arm irradiates the reference light split from the coupled wavelength-swept light output from the light emission apparatus 700 and receives response light returned as the reference light is reflected.

Figure 7B:
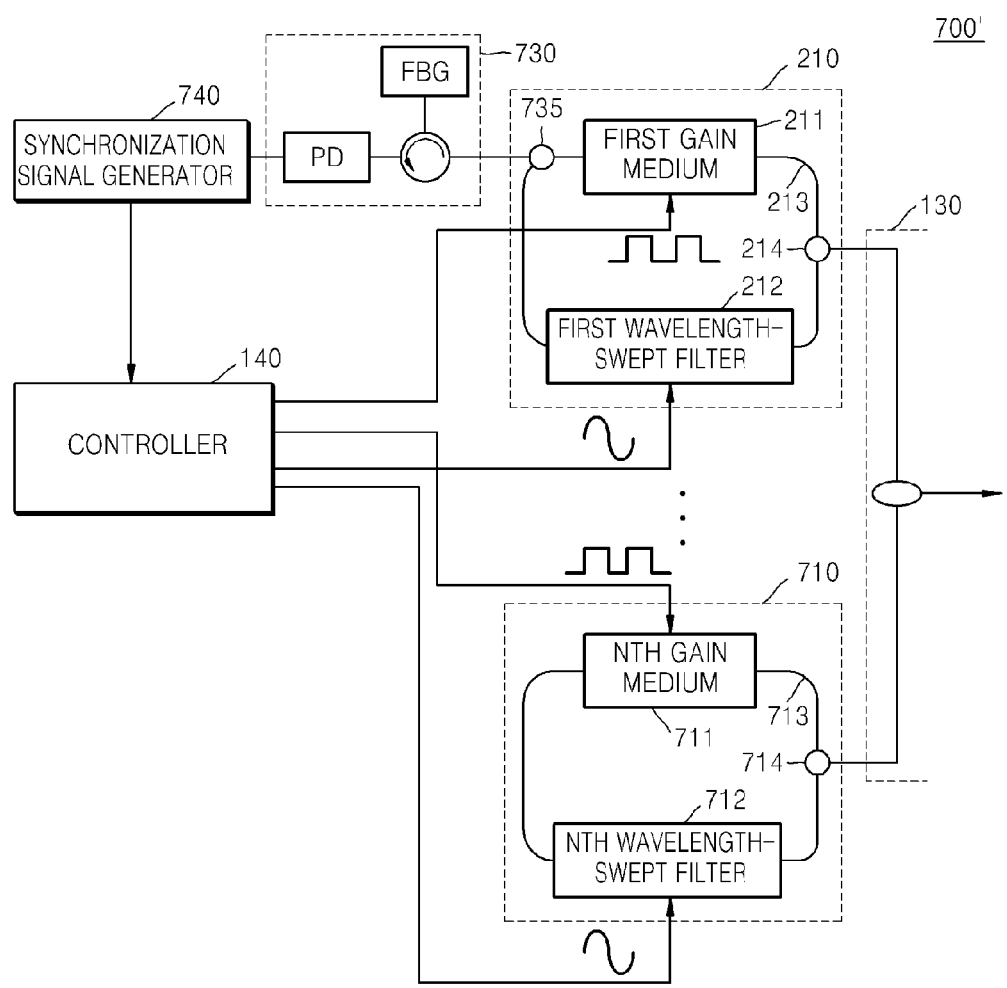
FIG. 7B is a block diagram for describing another example of an operation of a controller of the light emission apparatus of FIG. 1 to control one or more optical generators.

FIG. 7B is a block diagram for describing another example of an operation of the controller 140 of FIG. 1 to control one or more optical generators. Since a first optical generator 210 to an Nth optical generator 710, a coupling unit 130, a controller 140, an optical signal extractor 730, and a synchronization signal generator 740 of a light emission apparatus 700' shown in FIG. 7B correspond to the first optical generator 210 to the Nth optical generator 710, the coupling unit 130, the controller 140, the optical signal extractor 730, and the synchronization signal generator 740 shown in FIG. 7A, respectively, a description thereof will not be repeated.

Referring to FIG. 7B, the optical signal extractor 730 extracts an optical signal from first wavelength-swept light generated by the first optical generator 210. In this case, the first optical generator 210 may further include a coupler 735 for outputting a portion of the first wavelength-swept light from the first optical generator 210 to allow the optical signal extractor 730 to extract the optical signal from the first wavelength-swept light. The portion of the first wavelength-swept light split from the first optical generator 210 by the coupler 735 is input to the optical signal extractor 730. Like the optical signal extractor 730 of FIG. 7A, the optical signal extractor 730 of FIG. 7B may be implemented by a PD, an FBG, and a circulator, but is not limited thereto. That is, the optical signal extractor 730 of FIG. 7B may be implemented by various devices as will be apparent to one of ordinary skill in the art.

Like the optical signal being extracted from the first wavelength-swept light generated by the first optical generator 210, the optical signal extractor 730 may extract an optical signal from second to Nth wavelength-swept lights generated by the second optical generator (not shown) to the Nth optical generator 710. Thus, the optical signal extractor 730 may extract an optical signal of a predetermined wavelength region from any one of the first to Nth wavelength-swept lights or from wavelength-swept light obtained by coupling the first to Nth wavelength-swept lights.

Figure 8:
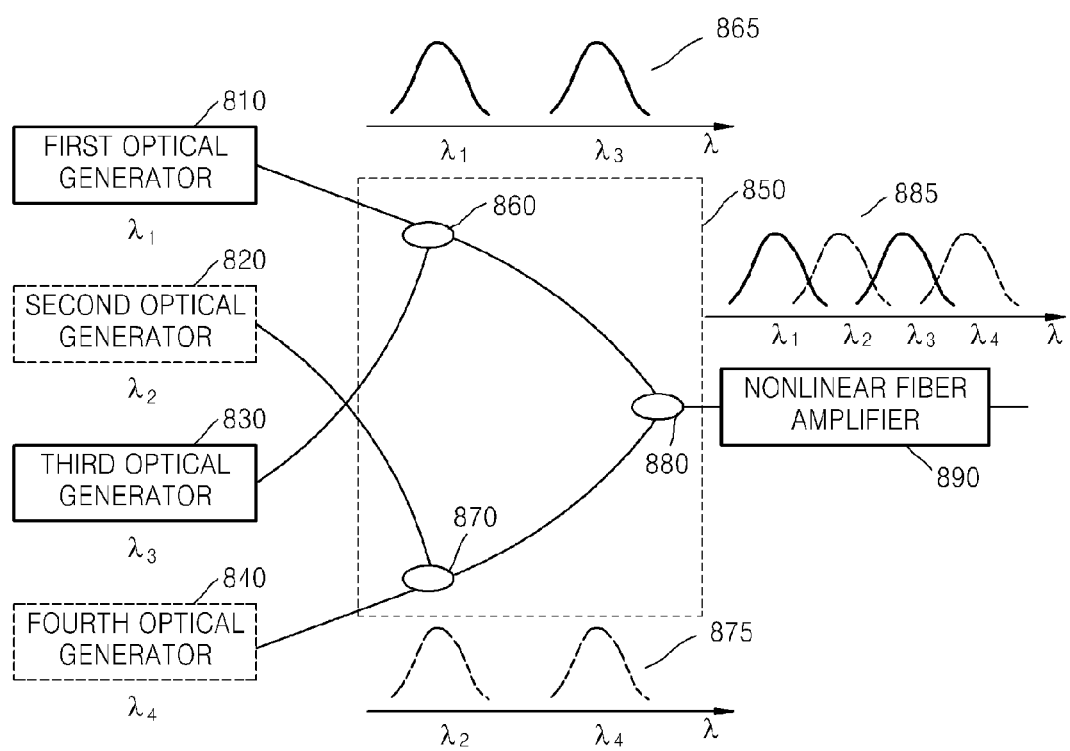
FIG. 8 is a block diagram of another example of a light emission apparatus.

FIG. 8 is a block diagram of another example of a light emission apparatus 800. Referring to FIG. 8, the light emission apparatus 800 includes a first optical generator 810, a second optical generator 820, a third optical generator 830, a fourth optical generator 840, a coupling unit 850, and a nonlinear fiber amplifier 890. The coupling unit 850 may include a first coupler 860, a second coupler 870, and a third coupler 880.

Although a controller (not shown) for controlling intensities and wavelength regions of wavelength-swept lights generated by the first to fourth optical generators 810 to 840 is not shown in the light emission apparatus 800 to avoid obscuring the features of this example, it will be understood by one of ordinary skill in the art that the controller may be provided inside or outside the light emission apparatus 800 of FIG. 8.

The first optical generator 810 generates first wavelength-swept light having a first center wavelength $\lambda 1$ of which an intensity and a wavelength region have been controlled by the controller.

The second optical generator 820 generates second wavelength-swept light having a second center wavelength $\lambda 2$ of which an intensity and a wavelength region have been controlled by the controller.

The third optical generator 830 generates third wavelength-swept light having a third center wavelength $\lambda 3$ of which an intensity and a wavelength region have been controlled by the controller, wherein the third wavelength-swept light has a wavelength region other than that of the first wavelength-swept light.

The fourth optical generator 840 generates fourth wavelength-swept light having a fourth center wavelength $\lambda 4$ of which an intensity and a wavelength region have been controlled by the controller, wherein the fourth wavelength-swept light has a wavelength region other than that of the second wavelength-swept light.

The first to fourth optical generators 810 to 840 may be implemented in the same form as the optical generators described in FIG. 2 to FIG. 6. For example, the first to fourth optical generators 810 to 840 may be implemented in the same form as the first or second optical generator 210 or 220 shown in FIG. 2. Here, the controller may control an intensity and a wavelength region of each of the first, second, third, and fourth wavelength-swept lights by controlling a magnitude and an on/off timing of a current to be applied to each of a first gain medium to a fourth gain medium (not shown). Alternatively, the first to fourth optical generators 810 to 840 may be implemented in the same form as the first or second optical generator 310 or 320 shown in FIG. 3. Here, the controller may control an intensity and a wavelength region of each of the first, second, third, and fourth wavelength-swept lights by controlling a magnitude and an on/off timing of a current to be applied to each of first to fourth optical amplifiers (not shown).

The coupling unit 850 outputs an output wavelength-swept light by coupling the first, second, third, and fourth wavelength-swept lights. Accordingly, the light emission apparatus 800 outputs the output wavelength-swept light obtained by coupling the first, second, third, and fourth wavelength-swept lights of which intensities and wavelength regions have been controlled.

For example, the coupling unit 850 includes the first coupler 860, the second coupler 870, and the third coupler 880. In this case, the first coupler 860 may couple the first wavelength-swept light and the third wavelength-swept light, the second coupler 870 may couple the second wavelength-swept light and the fourth wavelength-swept light, and the third coupler 880 may output the output wavelength-swept light by coupling coupled wavelength-swept light of the first wavelength-swept light and the third wavelength-swept light, and coupled wavelength-swept light of the second wavelength-swept light and the fourth wavelength-swept light. Accordingly, the wavelength-swept light output from the first coupler 860 is coupled wavelength-swept light of the first wavelength-swept light having the first center wavelength $\lambda 1$ and the third wavelength-swept light having the third center wavelength $\lambda 3$. The coupled wavelength-swept light of the first coupler 860 may have such a shape of a spectrum 865 of FIG. 8. The wavelength-swept light output from the second coupler 870 is coupled wavelength-swept light of the second wavelength-swept light having the first center wavelength $\lambda 2$ and the fourth wavelength-swept light having the fourth center wavelength $\lambda 4$. The coupled wavelength-swept light of the second coupler 870 may have a shape of a spectrum 875 of FIG. 8. The third coupler 880 may generate the output wavelength-swept light having a shape of a spectrum 885 by coupling the coupled wavelength-swept light of the spectrum 865 and the coupled wavelength-swept light of the spectrum 875.

In one example, the first coupler 860 may couple the first wavelength-swept light and the third wavelength-swept light using a WDM method, and the second coupler 870 may couple the second wavelength-swept light and the fourth wavelength-swept light using a WDM method. Then, the third coupler 880 may couple the coupled wavelength-swept light of the first coupler 860 and the coupled wavelength-swept light of the second coupler 870 using a WDM method. Alternatively, the coupling unit 850 may couple wavelength-swept lights generated by the first to fourth optical generators 810 to 840 using in various methods as will be apparent to one of ordinary skill in the art.

The nonlinear fiber amplifier 890 amplifies the wavelength-swept light output from the coupling unit 850 using the nonlinearity of an optical fiber. The nonlinear optical fiber amplifier 890 may compensate for a coupling loss in wavelength-swept light that may occur in a process of coupling wavelength-swept lights in the coupling unit 850.

Figure 9:
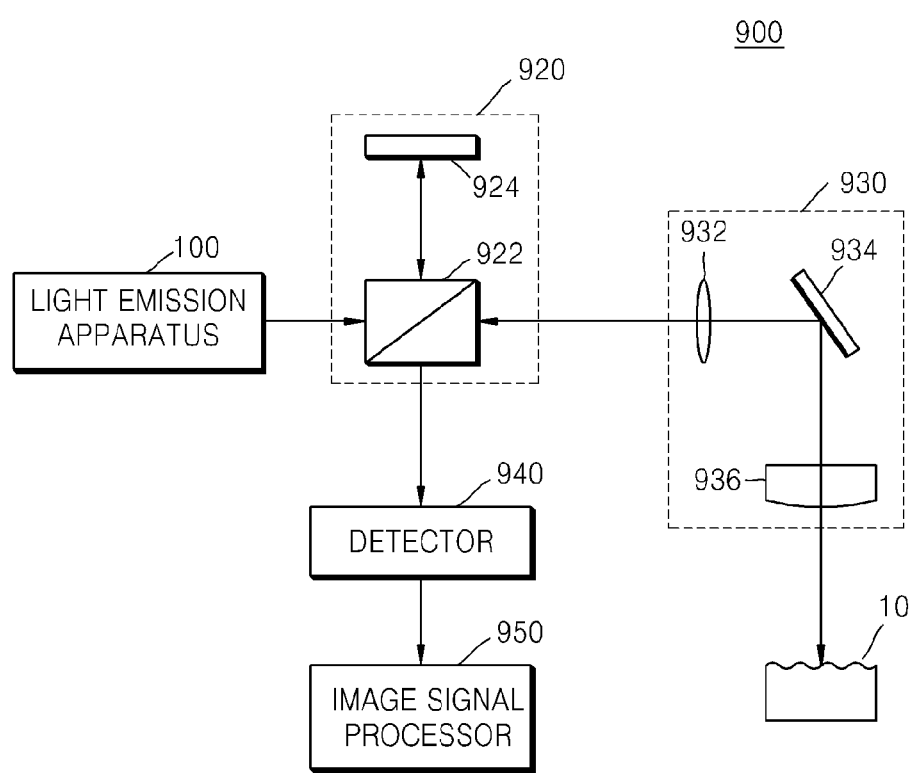
FIG. 9 is a block diagram of an example of an optical coherence tomography apparatus including the light emission apparatus of FIG. 1.

FIG. 9 is a block diagram of an example of an optical coherence tomography apparatus 900 including the light emission apparatus 100 of FIG. 1. However, the light emission apparatus 100 included in the optical coherence tomography apparatus 900 may be any one of the light emission apparatuses 100 to 800 shown in FIGS. 1 to 8. Accordingly, although omitted hereinafter, the description related to the light emission apparatuses 100 to 800 shown in FIGS. 1 to 8 is also applicable to the light emission apparatus 100 shown in FIG. 9. Hereinafter, for convenience of description, it will be assumed that the light emission apparatus 100 shown in FIG. 9 is the light emission apparatus 100 shown in FIG. 1.

For the light emission apparatus 100 shown in FIG. 9, only components associated with this example are shown in FIG. 9 to prevent the features of this example from being obscured. Thus, it will be understood by one of ordinary skill in the art that other general-use components may be provided in addition to the components shown in FIG. 9.

The light emission apparatus 100 controls either one or both of magnitudes and on/off timings of currents to be applied to the first gain medium of the first optical generator 110 and the second gain medium of the second optical generator 120 to control an intensity and a wavelength region of each of first wavelength-swept light and second wavelength-swept light, generates the first wavelength-swept light having the first center wavelength based on the current applied to the first gain medium in the first optical generator 110, generates the second wavelength-swept light having the second center wavelength based on the current applied to the second gain medium in the second optical generator 210, and outputs an output wavelength-swept light by coupling the first wavelength-swept light and the second wavelength-swept light. The light emission apparatus 100 outputs the output wavelength-swept light to an interferometer 920.

In one example, the light emission apparatus 100 may control either one or both of magnitudes and on/off timings of currents to be applied to the first optical amplifier of the first optical generator 110 and the second optical amplifier of the second optical generator 120 to control an intensity and a wavelength region of each of first wavelength-swept light and second wavelength-swept light, and may output the output wavelength-swept light by coupling the first wavelength-swept light and the second wavelength-swept light.

The interferometer 920 splits the output wavelength-swept light output from the light emission apparatus 100 into measurement light and reference light, irradiates the measurement light to a target object 10, and receives response light returned as the measurement light is reflected by the target object 10.

The interferometer 920 includes a beam splitter 922 and a reference mirror 924. The output wavelength-swept light output from the light emission apparatus 100 is split into the measurement light and the reference light by the beam splitter 922. Among the lights split by the beam splitter 922, the measurement light is provided to an optical probe 930, and the reference light is provided to the reference mirror 924, reflected by the reference mirror 924, and returned to the beam splitter 922. The measurement light provided to the optical probe 930 is irradiated on the target object 10 for which internal tomographic images are to be captured, and the response light returned as the irradiated measurement light is reflected by the target object 10 is provided to the beam splitter 922 via the optical probe 930. The provided response light and the reference light reflected by the reference mirror 924 interfere with each other to produce interference in the beam splitter 922.

The optical probe 930 includes a collimator lens 932, a galvano scanner 934, and a lens 936. The galvano scanner 934 is a mirror rotatable within a predetermined radius on a certain axis, and may be implemented by a Micro Electro Mechanical System (MEMS) scanner that obtains a driving force needed for the rotation from an MEMS. The measurement light provided from the interferometer 920 is collimated by passing through the collimator lens 932 of the optical probe 930, a traveling direction of the collimated measurement light is adjusted by being reflected by the galvano scanner 934, and the direction-adjusted measurement light is irradiated on the target object 10 after passing through the lens 936.

A detector 940 detects an interference signal generated due to the interference between the response light and the reference light. The detector 940 transmits the detected interference signal to an image signal processor 950.

The image signal processor 950 generates a tomographic image of the target object 10 using the interference signal. The image signal processor 950 converts the interference signal into an image signal representing the tomographic image of the target object 10.

Accordingly, the optical coherence tomography apparatus 900 may acquire high-resolution tomographic images of which a resolution in an axis direction is improved by acquiring tomographic images of the target object 10 using broadband wavelength-swept light emitted from the light emission apparatus 100.

Figure 10:
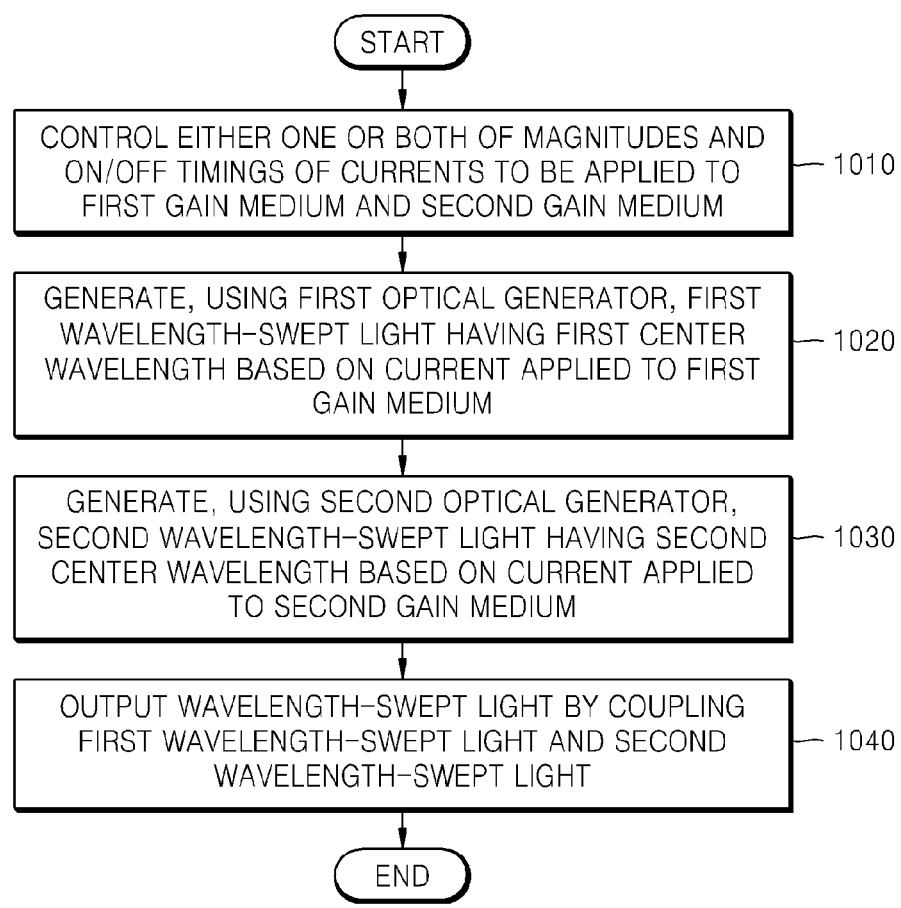
FIG. 10 is a flowchart illustrating an example of a method of emitting wavelength-swept light in a light emission apparatus.

FIG. 10 is a flowchart illustrating an example of a method of emitting wavelength-swept light in a light emission apparatus. Referring to FIG. 10, the method includes operations sequentially processed by any one of the light emission apparatuses 100 to 800 shown in FIGS. 1 to 9. Thus, although omitted hereinafter, the description related to the light emission apparatuses 100 to 800 shown in FIGS. 1 to 9 is also applicable to the method of FIG. 10.

In operation 1010, the controller 140 controls either one or both of magnitudes and on/off timings of currents to be applied to the first gain medium of the first optical generator 110 and the second gain medium of the second optical generator 120. Thus, the controller 140 may control an intensity and a wavelength region of each of first wavelength-swept light to be generated by the first optical generator 110 and second wavelength-swept light to be generated by the second optical generator 120.

In operation 1020, the first optical generator 110 generates the first wavelength-swept light having a first center wavelength based on the current applied to the first gain medium.

In operation 1030, the second optical generator 120 generates the second wavelength-swept light having a second center wavelength based on the current applied to the second gain medium.

In operation 1040, the coupling unit 130 couples the first wavelength-swept light and the second wavelength-swept light to emit an output wavelength-swept light.

As described above, in the various examples, when the light emission apparatus generates one broadband wavelength-swept light by coupling two or more wavelength-swept lights having different wavelength regions, the light emission apparatus may control an intensity and a wavelength region of each of the wavelength-swept lights by controlling either one or both of a magnitude and an on/off timing of a current to be applied to each of the gain media of the optical generators or optical amplifiers so that a spectrum of the finally output broadband wavelength-swept light has a Gaussian shape.

In addition, when the light emission apparatus generates one broadband wavelength-swept light by coupling two or more wavelength-swept lights having different wavelength regions, the light emission apparatus may remove intensity noise occurring due to overlapping of wavelength regions of the wavelength-swept lights by controlling on/off timings of currents to be applied to gain media of optical generators or optical amplifiers so that the wavelength regions of the wavelength-swept lights do not overlap with each other.

In addition, the light emission apparatus may compensate for a coupling loss occurring due to coupling of two or more wavelength-swept lights having different wavelength regions by individually controlling wavelength regions and intensities of the wavelength-swept lights to be coupled.

The controller 140 that performs the operations illustrated in FIG. 10, the synchronization signal generator 740, and the image signal processor 950 described above may be implemented using one or more hardware components, one or more software components, or a combination of one or more hardware components and one or more software components.

A hardware component may be, for example, a physical device that physically performs one or more operations, but is not limited thereto. Examples of hardware components include resistors, capacitors, inductors, power supplies, frequency generators, operational amplifiers, power amplifiers, low-pass filters, high-pass filters, band-pass filters, analog-to-digital converters, digital-to-analog converters, and processing devices.

A software component may be implemented, for example, by a processing device controlled by software or instructions to perform one or more operations, but is not limited thereto. A computer, controller, or other control device may cause the processing device to run the software or execute the instructions. One software component may be implemented by one processing device, or two or more software components may be implemented by one processing device, or one software component may be implemented by two or more processing devices, or two or more software components may be implemented by two or more processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

A processing device configured to implement a software component to perform an operation A may include a processor programmed to run software or execute instructions to control the processor to perform operation A. In addition, a processing device configured to implement a software component to perform an operation A, an operation B, and an operation C may have various configurations, such as, for example, a processor configured to implement a software component to perform operations A, B, and C; a first processor configured to implement a software component to perform operation A, and a second processor configured to implement a software component to perform operations B and C; a first processor configured to implement a software component to perform operations A and B, and a second processor configured to implement a software component to perform operation C; a first processor configured to implement a software component to perform operation A, a second processor configured to implement a software component to perform operation B, and a third processor configured to implement a software component to perform operation C; a first processor configured to implement a software component to perform operations A, B, and C, and a second processor configured to implement a software component to perform operations A, B, and C, or any other configuration of one or more processors each implementing one or more of operations A, B, and C. Although these examples refer to three operations A, B, C, the number of operations that may implemented is not limited to three, but may be any number of operations required to achieve a desired result or perform a desired task.

Software or instructions for controlling a processing device to implement a software component may include a computer program, a piece of code, an instruction, or some combination thereof, for independently or collectively instructing or configuring the processing device to perform one or more desired operations. The software or instructions may include machine code that may be directly executed by the processing device, such as machine code produced by a compiler, and/or higher-level code that may be executed by the processing device using an interpreter. The software or instructions and any associated data, data files, and data structures may be embodied permanently or temporarily in any type of machine, component, physical or virtual equipment, computer storage medium or device, or a propagated signal wave capable of providing instructions or data to or being interpreted by the processing device. The software or instructions and any associated data, data files, and data structures also may be distributed over network-coupled computer systems so that the software or instructions and any associated data, data files, and data structures are stored and executed in a distributed fashion.

For example, the software or instructions and any associated data, data files, and data structures may be recorded, stored, or fixed in one or more non-transitory computer-readable storage media. A non-transitory computer-readable storage medium may be any data storage device that is capable of storing the software or instructions and any associated data, data files, and data structures so that they can be read by a computer system or processing device. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, or any other non-transitory computer-readable storage medium known to one of ordinary skill in the art.

Functional programs, codes, and code segments for implementing the examples disclosed herein can be easily constructed by a programmer skilled in the art to which the examples pertain based on the drawings and their corresponding descriptions as provided herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A light emission apparatus for emitting wavelength-swept light, the light emission apparatus comprising:
   a first optical generator configured to generate first wavelength-swept light and comprising a first gain medium, a first wavelength-swept filter, and a first optical resonance unit;
   a second optical generator configured to generate second wavelength-swept light having a center wavelength that is different from a center wavelength of the first wavelength-swept light and comprising a second gain medium, a second wavelength-swept filter, and a second optical resonance unit;
   a controller configured to:
      control, based on a synchronization signal, an intensity and a wavelength region of each of the first wavelength-swept light and the second wavelength-swept light by controlling on/off timing of a first current to be applied to the first gain medium and the second current to be applied to the second gain medium, and
      control the on/off timings of the first current and the second current so that the second current is off while the first current stays on and the first current is off while the second current stays on;
   a light coupler configured to couple the first wavelength swept light and the second wavelength swept light to output an output wavelength-swept light for emission;
   an optical signal extractor configured to extract an optical signal in a predetermined wavelength region of any one of the first wavelength-swept light, the second wavelength-swept light, and the output wavelength-swept light; and
   a synchronization signal generator configured to generate, based on the extracted optical signal, the synchronization signal.

2. The light emission apparatus of claim 1, wherein the controller is further configured to control the intensity and the wavelength region of each of the first wavelength-swept light and the second wavelength-swept light so that a spectrum of the output wavelength-swept light has a Gaussian shape.

3. The light emission apparatus of claim 1, wherein:
   the synchronization signal generator is further configured to generate the synchronization signal for synchronizing an operation of performing stimulated emission and amplification of light in each of the first gain medium and the second gain medium with an operation of sweeping wavelengths of lights in a respective one of the first wavelength-swept filter of the first optical generator and the second wavelength-swept filter of the second optical generator based on the extracted optical signal; and
   the controller is further configured to control the first gain medium, the second gain medium, the first wavelength-swept filter, and the second wavelength-swept filter by generating currents to be applied to the first gain medium and the second gain medium and voltages to be applied to the first wavelength-swept filter and the second wavelength-swept filter based on the synchronization signal.

4. The light emission apparatus of claim 3, wherein the light emission apparatus is further configured to output the output wavelength-swept light to an interferometer; and
   the optical signal extractor is further configured to extract an optical signal in a predetermined wavelength region of the output wavelength-swept light from a reference arm of the interferometer.

5. The light emission apparatus of claim 1, further comprising:
   a third optical generator configured to generate third wavelength-swept light having a wavelength region other than a wavelength region of the first wavelength-swept light; and
   a fourth optical generator configured to generate fourth wavelength-swept light having a wavelength region other than a wavelength region of the second wavelength-swept light;
   wherein the light coupler is further configured to output the output wavelength-swept light by coupling the first wavelength-swept light, the second wavelength-swept light, the third wavelength-swept light, and the fourth wavelength-swept light; and
   the controller is further configured to control an intensity and a wavelength region of each of the first wavelength-swept light, the second wavelength-swept light, the third wavelength-swept light, and the fourth wavelength-swept light.

6. The light emission apparatus of claim 5, wherein the light coupler is further configured to couple the first wavelength-swept light and the third wavelength-swept light using a wavelength-division multiplexing (WDM) method, couple the second wavelength-swept light and the fourth wavelength-swept light using a WDM method, and output the output wavelength-swept light by coupling coupled wavelength-swept light of the first wavelength-swept light and the third wavelength-swept light and coupled wavelength-swept light of the second wavelength-swept light and the fourth wavelength-swept light.

7. The light emission apparatus of claim 1, further comprising at least one additional optical generator;
   wherein the light coupler is further configured to output the output wavelength-swept light by coupling the first wavelength-swept light, the second wavelength-swept light, and an additional wavelength-swept light generated by the at least one additional optical generator; and the controller is further configured to control an intensity and a wavelength region of each of the first wavelength-swept light, the second wavelength-swept light, and the wavelength-swept light generated by the at least one additional optical generator.

8. The light emission apparatus of claim 1, further comprising a nonlinear fiber amplifier configured to amplify wavelength-swept light coupled by the light coupler.

9. The light emission apparatus of claim 1, wherein
the second gain medium has different physical characteristics from the first gain medium, and
wherein the center wavelength of the second wavelength-swept light is determined based on the different physical characteristics of the second gain medium.

10. A light emission apparatus for emitting wavelength-swept light, the light emission apparatus comprising:
a first optical generator configured to generate first wavelength-swept light and comprising a first gain medium, a first wavelength-swept filter, a first optical resonance unit, and a first optical amplifier;
a second optical generator configured to generate second wavelength-swept light having a center wavelength that is different from a center wavelength of the first wavelength-swept light and comprising a second gain medium, a second wavelength-swept filter, a second optical resonance unit, and a second optical amplifier;
wherein the first optical generator is further configured to generate the first wavelength-swept light by using the first optical amplifier to amplify wavelength-swept light generated using the first gain medium, the first wavelength-swept filter, and the first optical resonance unit;
wherein the second optical generator is further configured to generate the second wavelength-swept light by using the second optical amplifier to amplify wavelength-swept light generated using the second gain medium, the second wavelength-swept filter, and the second optical resonance unit;
a controller configured to control on/off timings of a first current to be applied to the first optical amplifier and a second current to be applied to the second optical amplifier so that the second current is off while the first current stays on and the first current is off while the second current stays on;
a light coupler configured to couple the first wavelength-swept light and the second wavelength-swept light to output an output wavelength-swept light for emission;
an optical signal extractor configured to extract an optical signal in a predetermined wavelength region of any one of the first wavelength-swept light, the second wavelength-swept light, and the output wavelength-swept light; and
a synchronization signal generator configured to generate, based on the extracted optical signal, a synchronization signal,
wherein the controller is further configured to control, based on the synchronization signal, an intensity and a wavelength region of each of the first wavelength-swept light and the second wavelength-swept light.

11. The light emission apparatus of claim 10, wherein the first optical generator further comprises a first buffer configured to store wavelength-swept lights generated using the first gain medium, the first wavelength-swept filter, and the first optical resonance unit;

the second optical generator further comprises a second buffer configured to store wavelength-swept lights generated using the second gain medium, the second wavelength-swept filter, and the second optical resonance unit;

the first optical generator is further configured to generate third wavelength-swept light swept in a wavelength region other than wavelength regions of the wavelength-swept lights stored in the first buffer, and generate the first wavelength-swept light by using the first optical amplifier to amplify wavelength-swept light obtained by coupling the third wavelength-swept light and the wavelength-swept lights stored in the first buffer; and the second optical generator is further configured to generate fourth wavelength-swept light swept in a wavelength region other than wavelength regions of the wavelength-swept lights stored in the second buffer, and generate the second wavelength-swept light by using the second optical amplifier to amplify wavelength-swept light obtained by coupling the fourth wavelength-swept light and the wavelength-swept lights stored in the second buffer.

12. The light emission apparatus of claim 10, further comprising at least one additional optical generator comprising a gain medium, a wavelength-swept filter, an optical resonance unit, and an optical amplifier;
wherein the light coupler is further configured to output the output wavelength-swept light by coupling the first wavelength-swept light, the second wavelength-swept light, and an additional wavelength-swept light generated by the at least one additional optical generator; and
the controller is further configured to control an intensity and a wavelength region of each of the first wavelength-swept light, the second wavelength-swept light, and the wavelength-swept light generated by the at least one additional optical generator by controlling either one or both of magnitudes and on/off timings of currents to be applied to the first optical amplifier, the second optical amplifier, and the optical amplifier of the at least one additional optical generator.

13. A method of emitting wavelength-swept light, the method comprising:
controlling, based on a synchronization signal, either one or both of magnitude and on/off timing of a first current to be applied to a first gain medium of a first optical generator and a second current to be applied to a second gain medium of a second optical generator to control an intensity and a wavelength region of each of first wavelength-swept light and second wavelength-swept light;
generating the first wavelength-swept light having a first center wavelength based on a first current applied to the first gain medium of the first optical generator;
generating the second wavelength-swept light having a second center wavelength based on a second current applied to the second gain medium of the second optical generator;
controlling the on/off timings of the first current and the second current so that the second current is off while the first current stays on and the first current is off while the second current stays on; and
emitting an output wavelength-swept light by coupling the first wavelength-swept light and the second wavelength-swept light;
extracting an optical signal in a predetermined wavelength region of any one of the first wavelength-swept light, the second wavelength-swept light, and the output wavelength-swept light; and generating, based on the extracted optical signal, the synchronization signal.

14. The method of claim 13, wherein the controlling either one or both of magnitudes and on/off timings of the first current and the second current comprises controlling the intensity and the wavelength region of each of the first wavelength-swept light and the second wavelength-swept light so that a spectrum of the output wavelength-swept light has a Gaussian shape.

15. The method of claim 13, further comprising:

extracting an optical signal in a predetermined wavelength region of any one of the first wavelength-swept light, the second wavelength-swept light, and the output wavelength-swept light; and generating a synchronization signal for synchronizing an operation of performing stimulated emission and amplification of light in each of the first gain medium and the second gain medium with an operation of sweeping wavelengths of lights in a respective one of a first wavelength-swept filter of the first optical generator and a second wavelength-swept filter of the second optical generator based on the extracted optical signal;

wherein the controlling comprises controlling operations of the first gain medium, the second gain medium, the first wavelength-swept filter, and the second wavelength-swept filter by generating currents to be applied to the first gain medium and the second gain medium and voltages to be applied to the first wavelength-swept filter and the second wavelength-swept filter based on the synchronization signal.

16. A non-transitory computer-readable storage medium storing program instructions for controlling a computer to perform the method of claim 13.

17. An optical coherence tomography apparatus comprising:

a light emission apparatus comprising a controller configured to:

control, based on a synchronization signal, on/off timing of a first current to be applied to a first gain medium of a first optical generator and a second current to be applied to a second gain medium of a second optical generator to control an intensity and a wavelength region of each of first wavelength-swept light and second wavelength-swept light, generate the first wavelength-swept light having a first center wavelength based on a first current applied to the first gain medium in the first optical generator, generate the second wavelength-swept light having a second center wavelength based on a second current applied to the second gain medium in the second optical generator, control the on/off timings of the first current and the second current so that the second current is off while the first current stays on and the first current is off while the second current stays on, emit an output wavelength-swept light by coupling the first wavelength-swept light and the second wavelength-swept light, extract an optical signal in a predetermined wavelength region of any one of the first wavelength-swept light, the second wavelength-swept light, and the output wavelength-swept light, and generate, based on the extracted optical signal, the synchronization signal;

an interferometer configured to split the output wavelength-swept light into measurement light and reference light, irradiate the measurement light on a target object, and receive response light returned as the measurement light is reflected by the target object;

a detector configured to detect an interference signal generated by interference of the response light and the reference light; and an image signal processor configured to generate tomography images of the target object using the detected interference signal.

18. The optical coherence tomography apparatus of claim 17, wherein the controller is further configured to control an intensity and the wavelength region of each of the first wavelength-swept light and the second wavelength-swept light so that a spectrum of the output wavelength-swept light has a Gaussian shape.

* * * * *